(12) United States Patent
Oda et al.

(10) Patent No.: US 8,076,844 B2
(45) Date of Patent: Dec. 13, 2011

(54) ORGANIC EL DISPLAY DEVICE AND MANUFACTURING METHOD OF THE SAME

(75) Inventors: Kouji Oda, Chiyoda-ku (JP); Hiroyuki Fuchigami, Chiyoda-ku (JP); Yusuke Yamagata, Chiyoda-ku (JP); Katsumi Nakagawa, Yokohama (JP); Junji Ohyama, Yokohama (JP)

(73) Assignee: Canon Kabushiki Kaisha, Tokyo (JP)

(*) Notice: Subject to any disclaimer, the term of this patent is extended or adjusted under 35 U.S.C. 154(b) by 580 days.

(21) Appl. No.: 11/968,836

(22) Filed: Jan. 3, 2008

(65) Prior Publication Data

US 2008/0164810 A1    Jul. 10, 2008

(30) Foreign Application Priority Data

Jan. 10, 2007    (JP) .................................. 2007-002676

(51) Int. Cl.
*H01L 51/50*    (2006.01)
(52) U.S. Cl. ........................................ 313/506; 313/504
(58) Field of Classification Search .................. 313/504, 313/503, 506; 445/24; 438/30; 257/59, 257/83
See application file for complete search history.

(56) References Cited

U.S. PATENT DOCUMENTS

| | | | |
|---|---|---|---|
| 6,891,194 B2* | 5/2005 | Izumi ................................ 257/59 |
| 7,071,617 B2* | 7/2006 | Utsumi et al. ................. 313/506 |
| 7,220,610 B2* | 5/2007 | Kim ................................. 438/30 |
| 7,391,151 B2* | 6/2008 | Koo et al. ...................... 313/504 |
| 7,423,373 B2* | 9/2008 | Sakakura et al. ............. 313/509 |
| 7,629,739 B2* | 12/2009 | Han et al. ...................... 313/504 |
| 2003/0094615 A1 | 5/2003 | Yamazaki et al. |
| 2003/0227021 A1* | 12/2003 | Yamazaki et al. ............... 257/83 |
| 2004/0056588 A1* | 3/2004 | Nozawa ......................... 313/504 |
| 2004/0253413 A1* | 12/2004 | Baba et al. .................... 428/141 |
| 2005/0023967 A1* | 2/2005 | Gotoh et al. .................. 313/504 |
| 2007/0096636 A1* | 5/2007 | Park et al. ..................... 313/503 |
| 2008/0150417 A1* | 6/2008 | Park .............................. 313/504 |

FOREIGN PATENT DOCUMENTS

| | | |
|---|---|---|
| JP | 2003-229250 A | 8/2003 |
| JP | 2003-257662 A | 9/2003 |
| JP | 2003-332058 | 11/2003 |
| JP | 2006-140145 A | 6/2006 |
| JP | 2006-302723 A | 11/2006 |
| KR | 2003-0072247 | 9/2003 |
| KR | 10-2006-0044066 | 5/2006 |
| KR | 10-2008-0057789 A | 6/2008 |

* cited by examiner

*Primary Examiner* — Peter Macchiarolo
*Assistant Examiner* — Mary Ellen Bowman

(57) ABSTRACT

An organic EL display device includes a glass substrate and a flattening film arranged above the glass substrate. A plurality of anodes are arranged on a surface of the flattening film. A plurality of organic EL layers are arranged on a surface of the anodes. The flattening film has irregularities formed in at least a partial surface in a region outside a region where the plurality of organic EL layers are arranged. According to such a structure, an organic EL display device in which remaining of moisture in an insulating film is suppressed can be provided.

6 Claims, 22 Drawing Sheets

ORGANIC EL DISPLAY DEVICE AND MANUFACTURING METHOD OF THE SAME

BACKGROUND OF THE INVENTION

1. Field of the Invention

The present invention relates to an organic EL display device and a manufacturing method of the same.

2. Description of the Background Art

In recent years, an organic EL (Electro Luminescence) display device including an organic EL element has increasingly been developed. As the organic EL display device is of a self-emitting type, a backlight as required in a liquid crystal display device is not necessary. In addition, as smaller thickness and lighter weight can be achieved and an angle of view is wide, the organic EL display device is expected to serve as a next-generation display. In particular, an active-matrix organic EL display device in which a thin film transistor (TFT) is arranged for each pixel as a drive element for driving an organic EL element has attracted attention.

A structure for extracting light that is emitted from a light-emitting layer includes a structure for extracting emitted light from the bottom side (hereinafter, referred to as "bottom emission structure") and a structure for extracting emitted light from the top side (hereinafter, referred to as "top emission structure"), with respect to a glass substrate on which a TFT or the like is formed. The top emission structure is capable of achieving higher definition and improved light extraction efficiency, because light is not blocked by the TFT.

An organic EL element has such a structure that an organic EL layer is sandwiched between an anode and a cathode. The organic EL layer may be implemented only by a light-emitting layer or by a multi-layer structure formed by layering a light-emitting layer, a hole transport layer and an electron injection layer. The organic EL element emits light, for example in such a manner that, by applying a voltage across the anode and the cathode, electrons injected from the cathode through the electron injection layer and holes injected from the anode through the hole transport layer are recombined within the organic EL layer. Meanwhile, the organic EL layer is composed of a low-molecular type organic EL material, a macromolecular type (polymeric) organic EL material, and the like. The low-molecular type organic EL material is formed with a vapor deposition method or the like. The macromolecular type organic EL material is formed with a coating method using spin coating or an ink jet method.

The organic EL element has such a disadvantage that deterioration thereof proceeds due to moisture, which leads to lower luminance and poor long-term reliability. As characteristics of the organic EL element are readily impaired by moisture, reaching of moisture to the organic EL element is preferably suppressed as much as possible. Moisture reaching the organic EL element is broadly categorized into moisture that is introduced from the outside of the display device and moisture contained in the display device.

Example of moisture that is introduced from the outside of the display device includes moisture contained in normal air in which the organic EL display device is used. The moisture passes through a pin hole or the like of the cathode in an uppermost layer that forms the organic EL element, and diffuses in the inside to cause, for example, such a defect that a non-emitting region called a dark spot grows in a circular shape.

Introduction of moisture from the outside of the display device is prevented by covering the entire surface of the organic EL element with a covering film such as a barrier layer formed with an inorganic insulating film composed of SiNx, SiOxNy or the like, a resin film, and a film implemented by layering these films. Alternatively, all of a plurality of organic EL elements are covered with a cover glass and then a peripheral portion of the cover glass is sealed with a photo-curing adhesive such as an epoxy resin, thus preventing introduction of moisture. Sealing with such a covering film and a cover glass is performed in a vacuum atmosphere or in a dry inert gas atmosphere having a dew point around −80° C.

Alternatively, a getter material or a getter film containing CaO, BaO, SrO, or the like is arranged in a space covered with a cover glass or the like. By arranging such a hygroscopic member, moisture that is introduced from the outside is absorbed, so that reaching of moisture to the organic EL element is suppressed.

An example of moisture contained in the display device includes moisture contained in an organic insulating film. Moisture present in a flattening film formed between the organic EL element and a surface where a TFT is formed and implemented by an organic insulating film represents one example. In addition, moisture present in an isolation film arranged to surround a pixel region where the organic EL layer is arranged and implemented by an organic insulating film represents one example. The isolation film is also referred to as a pixel isolation film, and it is formed, for example, to cover an end portion of an anode and a region where an anode is not present.

The organic insulating film may contain a photosensitive resin. The organic insulating film is formed, for example, by arranging a photosensitive resin with spin coating, thereafter performing exposure to form a desired pattern using a photomask, and thereafter performing a development treatment. After the development treatment, heat treatment is performed in atmosphere. The heat treatment is referred to as a curing and baking treatment or a post-baking treatment. By performing the curing and baking treatment, a coating solvent contained in the organic insulating film is removed and the insulating film is burnt. In the curing and baking treatment, for example, heating at a temperature of approximately 200° C. or higher and approximately 300° C. or lower is performed for 0.5 to 1 hour, although there is some difference depending on an organic material.

Japanese Patent Laying-Open No. 2003-332058 discloses a method of manufacturing an electroluminescence panel including the steps of: forming a first electrode on a substrate; forming an insulating layer around the first electrode; subjecting the insulating layer to heat treatment so as to lower an amount of moisture contained in the insulating layer; forming an electroluminescence layer on the insulating layer; and forming a second electrode on the electroluminescence layer.

Moisture contained in the organic EL display device diffuses to move toward the organic EL element. When the moisture reaches the organic EL element, such a defect that a dark region where emission intensity is low grows from a peripheral portion toward the center of a pixel appears. Thus, display characteristics of the organic EL display device are lowered due to moisture present in the display device. The moisture reaches the organic EL layer mainly through the flattening film or the isolation film as the diffusion path.

In general, the flattening film or the isolation film is implemented by an organic insulating film. As a material, the organic insulating film is likely to absorb moisture. Accordingly, the organic insulating film absorbs moisture in such steps as a wet treatment or a washing treatment with water in the manufacturing process. Alternatively, the organic insulating film absorbs a large amount of moisture during transportation through atmosphere.

Japanese Patent Laying-Open No. 2003-332058 above discloses heat treatment of the insulating layer for 1 hour to 3 hours at a temperature from 200° C. to 270° C. With the heat treatment, however, it has been difficult to sufficiently obtain stability of luminance and long-term reliability. Though an allowable upper temperature limit of the organic insulating film depends on a material for the same, an allowable upper temperature limit of a general organic insulating film is not lower than 200° C. and not higher than 300° C. For example, after continued use of a product while being heated for 3 hours at the allowable upper temperature limit, a dark region from an outer peripheral portion of a pixel was observed in several hundred hours.

In particular, an active-matrix organic EL display device having a TFT as a drive element for driving a pixel has such a complicated structure that a TFT, a capacitance portion, an interconnection, and the like are present under a pixel electrode and these elements are covered with a flattening film. Here, simply performing heat treatment described in the publication above has been insufficient to remove the contained moisture. Though a dehydration effect is enhanced by extending a time for dehydration, productivity in manufacturing the organic EL display device becomes poorer (poorer throughput). Therefore, it is not allowed to perform dehydration for a long time and a major problem of reliability has still remained.

In the step of manufacturing a flattening insulating film or an isolation film, a curing and baking step of performing heat treatment as a step of solidifying an organic insulating film after the organic insulating film is formed is present. For removal of moisture, a dehydration step using heat treatment is preferably performed other than the curing and baking step, however, a temperature and a time period for heating are restricted. Therefore, in a range of time ensuring throughput, it has been impossible to perform the dehydration step sufficient for suppressing deterioration of the organic EL element.

SUMMARY OF THE INVENTION

An object of the present invention is to provide an organic EL display device in which remaining of moisture in an insulating film is suppressed and a manufacturing method of the same.

An organic EL display device according to one aspect of the present invention includes: a substrate; a flattening film arranged above the substrate; a plurality of first electrodes arranged on a surface of the flattening film; and a plurality of organic EL layers arranged on a surface of the first electrodes. The flattening film has first irregularities formed in at least a partial surface, in a region outside a region where the plurality of organic EL layers are arranged.

An organic EL display device according to another aspect of the present invention includes: a substrate; a flattening film arranged above the substrate; a plurality of first electrodes arranged on a surface of the flattening film; a plurality of organic EL layers arranged on a surface of the first electrodes; and an isolation film arranged on the first electrodes and covering end portions of the first electrodes adjacent to each other. The isolation film has a slope portion with a gradually decreasing film thickness at an end portion, and has second irregularities in a surface of a region except for the slope portion.

A method of manufacturing an organic EL display device according to one aspect of the present invention includes the steps of: arranging a drive element on a surface of a substrate; forming a flattening film above the substrate; and performing heating after the step of forming a flattening film. The step of forming a flattening film includes the step of forming a plurality of connection holes for connection with the drive element. In addition, the manufacturing method includes the step of forming first irregularities in at least a partial surface, in a region outside a region where the plurality of connection holes are formed.

A method of manufacturing an organic EL display device according to another aspect of the present invention includes the steps of: arranging a drive element on a surface of a substrate; forming a flattening film having a plurality of connection holes corresponding to the drive element, above the substrate; forming a plurality of first electrodes for respective ones of a plurality of drive element; forming an isolation film so as to cover end portion of the first electrode adjacent to each other; and performing heating after the step of forming an isolation film. The step of forming an isolation film includes the step of forming an opening for arranging an organic EL layer. The step of forming an opening includes the step of forming a slope portion with a gradually decreasing thickness at an end portion of the isolation film. The step of forming an isolation film includes the step of forming second irregularities in a surface of the isolation film in a region except for the slope portion.

A method of manufacturing an organic EL display device according to yet another aspect of the present invention includes the steps of: arranging a drive element on a surface of a substrate; forming an organic insulating film above the substrate; forming irregularities for increasing a surface area in a surface of the organic insulating film; and performing heating while the surface of the organic insulating film is exposed.

According to the present invention, an organic EL display device in which remaining of moisture in an insulating film is suppressed and a method of manufacturing the same can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

An organic EL display device in a first embodiment of the present invention and a method of manufacturing the organic EL display device will be described with reference to FIGS. 1 to 19. The organic EL display device in the present embodiment is an active-matrix display device in which each pixel is arranged and each pixel is driven by a drive element. In addition, the organic EL display device in the present embodiment is a top-emission display device from which light is extracted through an upper surface.

Figure 1:
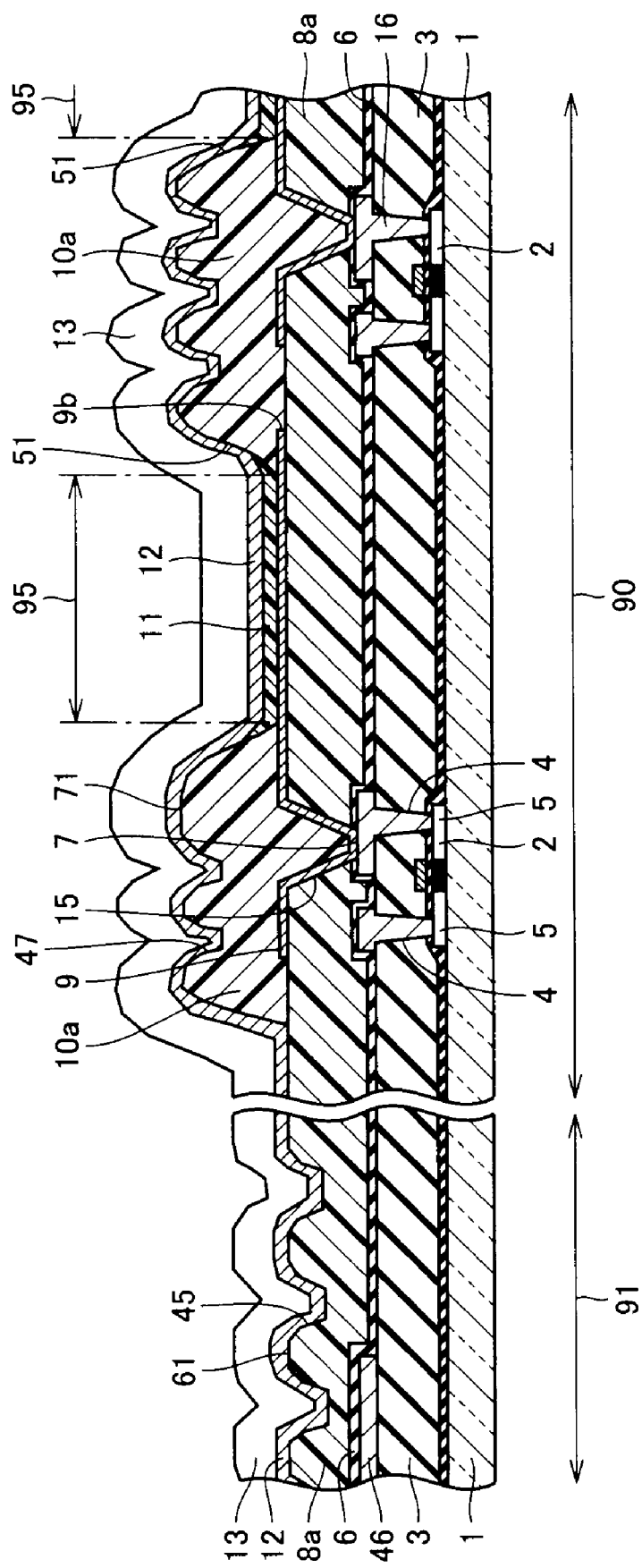
FIG. 1 is a schematic cross-sectional view of an organic EL display device in a first embodiment.

FIG. 1 is a schematic cross-sectional view of the organic EL display device in the present embodiment. The organic EL display device in the present embodiment has a display region shown with an arrow 90. The organic EL display device has a region outside the display region shown with an arrow 91.

Figure 2:
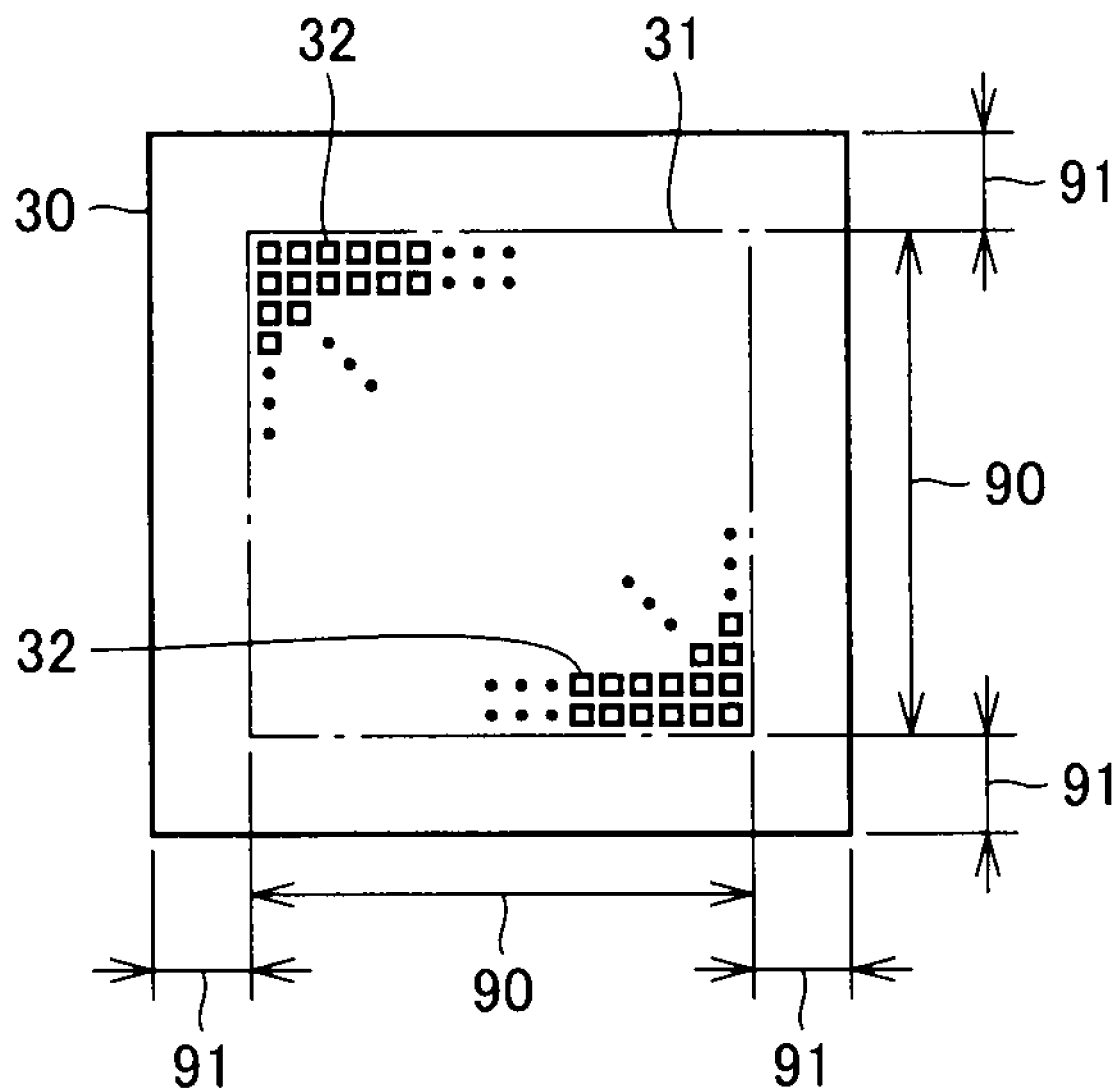
FIG. 2 is a schematic plan view of the organic EL display device in the first embodiment.

FIG. 2 is a schematic plan view of the organic EL display device in the present embodiment. In an organic EL display device 30 in the present embodiment, a display region 31 shown with arrow 90 is formed to have a substantially rectangular two-dimensional shape. In display region 31, a plurality of pixels 32 are arranged. The plurality of pixels 32 are regularly arranged. Pixels 32 are arranged at a distance from each other. A region outside display region 31 shown with arrow 91 is formed to surround the display region.

Referring to FIG. 1, the organic EL display device in the present embodiment includes a glass substrate 1 serving as the substrate. The organic EL display device includes a TFT 2 serving as a drive element arranged on a surface of glass substrate 1. TFT 2 is arranged in the display region shown with arrow 90. A region shown with an arrow 95 is a pixel region where an organic EL layer 11 emits light.

TFT 2 is formed for an anode 9 of each pixel. TFT 2 includes a source/drain region 5. In the present embodiment, out of source/drain region 5, a drain region is connected to anode 9 of each pixel.

An inorganic insulating film 3 is formed on a surface of TFT 2. Inorganic insulating film 3 is arranged above glass substrate 1. Inorganic insulating film 3 is formed to cover TFT 2.

In the display region, an interconnection hole 4 is formed in inorganic insulating film 3 to penetrate therethrough. Interconnection hole 4 is formed to reach source/drain region 5 of TFT 2. A source/drain interconnection 16 is arranged in interconnection hole 4. Source/drain interconnection 16 is in contact with source/drain region 5. Source/drain interconnection 16 is formed such that interconnection hole 4 is filled with source/drain interconnection 16.

In the region outside the display region, an interconnection 46 is formed on a surface of inorganic insulating film 3. Interconnection 46 is formed to linearly extend over the surface of inorganic insulating film 3.

A protection film 6 is arranged on inorganic insulating film 3. Protection film 6 is formed to cover a surface of source/drain interconnection 16, interconnection 46, and inorganic insulating film 3. Protection film 6 has a through hole 7. Through hole 7 is formed in correspondence with a position of source/drain interconnection 16 connected to the drain region.

The organic EL display device includes a flattening film 8a. Flattening film 8a in the present embodiment is an organic insulating film. Flattening film 8a is arranged above glass substrate 1. Flattening film 8a is formed to flatten a step formed in the surface due to TFT 2, source/drain interconnection 16, and the like. Flattening film 8a in the present embodiment is formed in the display region shown with arrow 90 and in the region outside the display region shown with arrow 91. Flattening film 8a is formed on the surface of protection film 6.

In the display region, an upper surface of flattening film 8a is formed as a plane. Flattening film 8a is formed such that its upper surface is flat in the pixel region shown with arrow 95. Flattening film 8a has a connection hole (contact hole) 15. Connection hole 15 is formed to penetrate flattening film 8a. Connection hole 15 is formed in correspondence with a position of the source/drain interconnection connected to each drain region. Connection hole 15 communicates with through hole 7.

Anode 9 serving as the first electrode is arranged on the upper surface of connection hole 15, through hole 7, and flattening film 8a. Anode 9 is formed for each pixel. Anode 9 is what is called a pixel electrode. Anode 9 is cut at an isolation portion 9b and formed to be isolated for each pixel. Anode 9 is formed over the entire pixel region shown with arrow 95.

In the region outside the display region, flattening film 8a has irregularities 61 serving as first irregularities formed in the upper surface. Irregularities 61 in the present embodiment are formed as a result of formation of a plurality of recess portions 45 in the upper surface of flattening film 8a. Recess portions 45 are regularly formed. In addition, recess portions and projecting portions are regularly formed to implement irregularities 61. Recess portion 45 in the present embodiment is formed with a photomechanical process, as will be described later.

The organic EL display device in the present embodiment has an isolation film 10a. Isolation film 10a is arranged above flattening film 8a. Isolation film 10a is formed from a material having an electrically insulating property. Isolation film 10a in the present embodiment is implemented by an organic insulating film.

Isolation film 10a is formed to expose the pixel region shown with arrow 95. Isolation film 10a is formed to cover end portions of anodes 9 opposed to each other. Isolation film 10a is formed to electrically insulate anode 9 for each pixel. Isolation film 10a is formed to surround each pixel.

Isolation film 10a is formed to have a substantially trapezoidal cross-sectional shape. Isolation film 10a has a slope portion 51 at an end portion. Slope portion 51 is formed such that a film thickness decreases toward a tip end of isolation film 10a.

Isolation film 10a in the present embodiment has irregularities 71 formed in the surface, that serve as second irregularities. Irregularities 71 are formed in a region except for slope portion 51. Irregularities 71 are formed not to penetrate isolation film 10a. Irregularities 71 in the present embodiment are formed as a result of formation of a plurality of recess portions 47 in the upper surface. Recess portion 47 in the present embodiment is formed with a photomechanical process, as will be described later. Recess portions 47 are regularly formed, and recess portions and projecting portions are regularly formed to implement irregularities 71.

The organic insulating film such as the flattening film and the isolation film in the present embodiment is formed from a positive photosensitive resin. Irregularities formed with a photomechanical process depend on a mask pattern for exposure. In the present embodiment, as openings in the mask pattern are regularly formed, portions serving as recess portions are regularly formed.

The organic EL display device in the present embodiment has organic EL layer 11. Organic EL layer 11 is arranged in a region surrounded by isolation film 10a. Organic EL layer 11 is formed in the pixel region shown with arrow 95. Organic EL layer 11 is arranged on the surface of anode 9. Organic EL layer 11 is formed such that its end portion covers a part of slope portion 51.

In the display region, a cathode 12 serving as the second electrode is formed on the surface of isolation film 10a and organic EL layer 11. Organic EL layer 11 is sandwiched between anode 9 and cathode 12. An organic EL element serving as a light-emitting element in the present embodiment includes organic EL layer 11, anode 9, and cathode 12. In the region outside the display region, cathode 12 is arranged on the surface of flattening film 8a. In the display region and the region outside the display region, a passivation film 13 for protecting the surface is formed on cathode 12.

As will be described later, in the organic EL display device in the present embodiment, moisture in the organic insulating film such as flattening film 8a or isolation film 10a can efficiently be removed during the manufacturing step and remaining of moisture in the organic EL display device can be suppressed. Therefore, deterioration of display characteristics such as lower luminance due to reaching of moisture to organic EL layer 11 can be suppressed.

The surface of the organic insulating film such as the flattening film or the isolation film without irregularities has an arithmetic mean deviation of roughness profile Ra (JIS B 0170-1993) of approximately 0.3 nm or greater and approximately 0.5 nm or smaller. Roughness of irregularities formed in the surface of the organic insulating film in the present embodiment is several orders of magnitude greater than the aforementioned surface roughness.

FIGS. 3 to 11 illustrate the steps of the method of manufacturing the organic EL display device in the present embodiment. FIGS. 3 to 11 are schematic cross-sectional views in respective steps.

Figure 3:
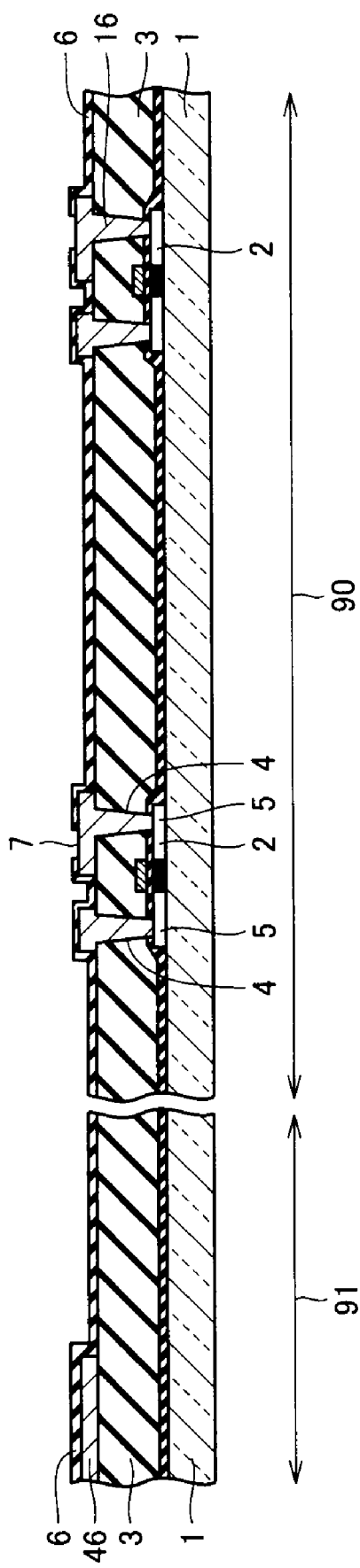
FIG. 3 is a cross-sectional view illustrating a first step of a method of manufacturing the organic EL display device in the first embodiment.

FIG. 3 is a cross-sectional view illustrating a first step of the method of manufacturing the organic EL display device in the present embodiment. TFT 2 including source/drain region 5 is formed on the surface of glass substrate 1 serving as the substrate. TFT 2 is arranged and formed in correspondence with each pixel. Here, the substrate is not limited to the glass substrate and any substrate may be employed. For example, a silicon substrate, a plastic substrate, or a substrate having a film formed on the surface may be employed.

Thereafter, inorganic insulating film 3 is formed above glass substrate 1 to cover TFT 2. In the present embodiment, a silicon oxide (SiO$_2$) film is formed as inorganic insulating film 3. The film thickness was set to 500 nm. Film forming conditions for forming the inorganic insulating film are for example such that SiH$_4$ (silane), O$_2$ (oxygen), and He (helium) are introduced into a reaction chamber at 30 sccm, 100 sccm, and 1000 sccm, respectively. Film forming was performed under such conditions that a film forming pressure was set to 100 Pa, a film forming temperature was set to 220° C., and high-frequency power was set to 0.8 kW.

Thereafter, interconnection hole 4 is formed with a photomechanical process so as to penetrate inorganic insulating film 3. Interconnection hole 4 is formed to reach source/drain region 5 of TFT 2.

Thereafter, source/drain interconnection 16 implemented by a three-layered structure is formed in the surface of inorganic insulating film 3. Source/drain interconnection 16 is patterned in a photomechanical process. Source/drain interconnection 16 is formed, for example, by successively forming a molybdenum film, an aluminum film and a molybdenum film, using DC magnetron sputtering. By arranging source/drain interconnection 16 in interconnection hole 4, source/drain interconnection 16 is connected to source/drain region 5.

Any material formed from a conductor having low resistance may be used for source/drain interconnection 16. For example, a material such as Al (aluminum), Cr (chromium), W (tungsten), or Mo (molybdenum) is used to form the interconnection consisting of a single layer or multiple layers. Interconnection 46 is formed in the region outside the display region shown with arrow 91.

Thereafter, protection film 6 is formed on the surface of inorganic insulating film 3, so as to cover source/drain interconnection 16. Protection film 6 in the present embodiment is implemented by a nitride film (Si$_3$N$_4$). Protection film 6 in the present embodiment was formed to a film thickness of 300 nm. In forming protection film 6 in the present embodiment, $SiH_4$ (silane), $NH_3$ (ammonia), and $N_2$ (nitrogen) are introduced into a reaction chamber at 30 sccm, 30 sccm, and 1000 sccm, respectively. Film forming is performed under such conditions that a film forming pressure is set to 130 Pa, a film forming temperature is set to 220° C., and high-frequency power is set to 1.0 kW.

Thereafter, through hole 7 is formed in protection film 6 to expose a part of source/drain interconnection 16, using a photomechanical process. In the surface of protection film 6, a step has been created in the manufacturing steps so far.

Figure 4:
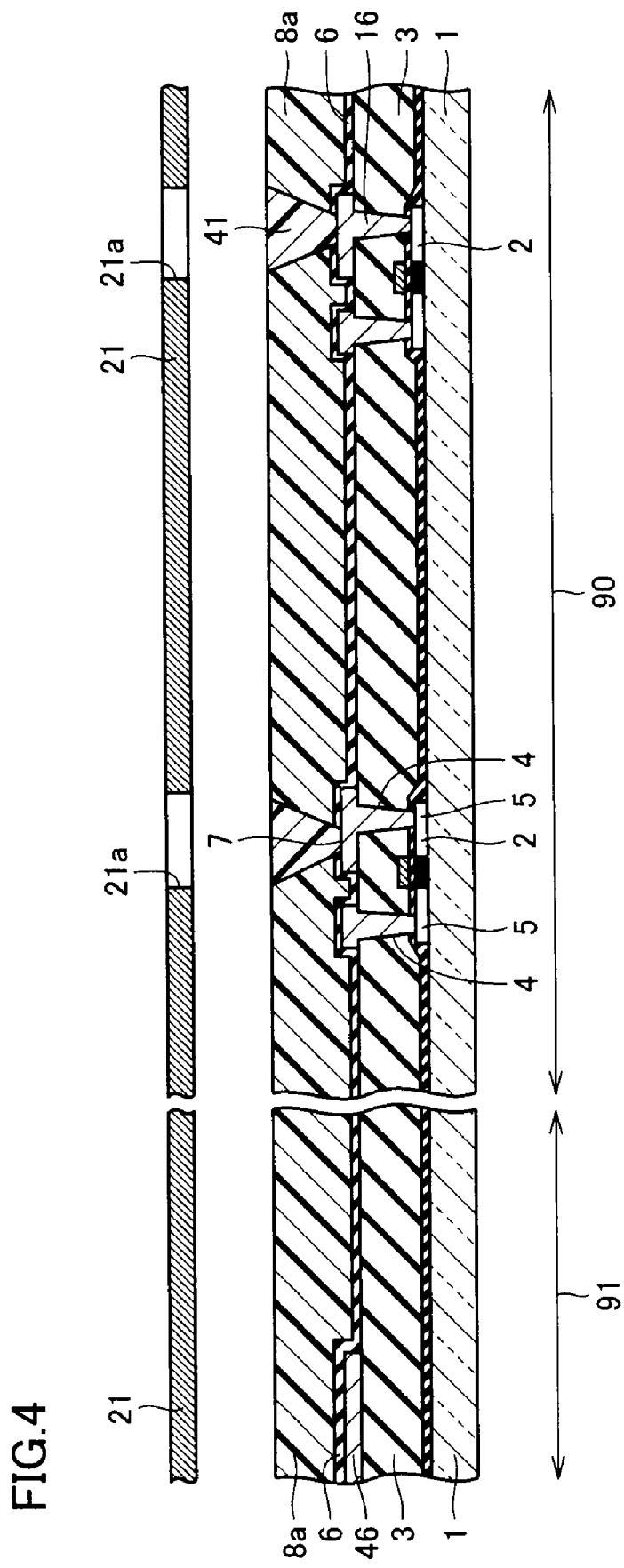
FIG. 4 is a cross-sectional view illustrating a second step of the method of manufacturing the organic EL display device in the first embodiment.

FIG. 4 is a cross-sectional view illustrating a second step of the method of manufacturing the organic EL display device in the present embodiment. Then, the step of forming the flattening film is performed, in which flattening film 8a for flattening the step in the surface of protection film 6 is formed.

In the present embodiment, in forming flattening film 8a, a photosensitive acrylic resin material is used as a first photosensitive material. In order for the surface of flattening film 8a to be sufficiently flat, the entire surface is coated with the photosensitive acrylic resin using spin coating to a thickness of approximately 1500 nm or greater and approximately 2000 nm or smaller. Thereafter, a pre-bake treatment is performed for 10 minutes in an environment set to a temperature of 90° C.

In the present embodiment, though the photosensitive acrylic resin is used for the flattening film, the embodiment is not limited as such, and other organic insulating films made, for example, of a photosensitive polyimide material may be employed. In addition, in the present embodiment, though the resin is arranged on the protection film with spin coating, the embodiment is not limited as such. Any method such as slit spin coating, roll coating, or spraying may be adopted.

Thereafter, a first exposure step of performing exposure using a photomask 21 is performed. Photomask 21 is a mask for forming a connection hole in the flattening film. Photomask 21 has an opening 21a. Opening 21a is formed in a region corresponding to the display region shown with arrow 90. Opening 21a is formed in correspondence with the connection hole in flattening film 8a that is subsequently formed.

Exposure is performed with photomask 21 being arranged such that opening 21a is located at a position substantially the same as through hole 7 in protection film 6. Complete exposure is performed in the first exposure step. Here, in the present invention, complete exposure refers to such exposure that an exposed object is completely removed in a prescribed development period, with respect to a direction of entire film thickness in which exposure is performed. A completely exposed portion 41 is formed in flattening film 8a. Completely exposed portion 41 is formed in the direction of entire thickness of flattening film 8a. For example, as a condition for performing complete exposure of the flattening film having a thickness of 1500 nm and containing an acrylic resin material, lamp luminous exposure of 280 $mJ/cm^2$ was optimal.

Figure 5:
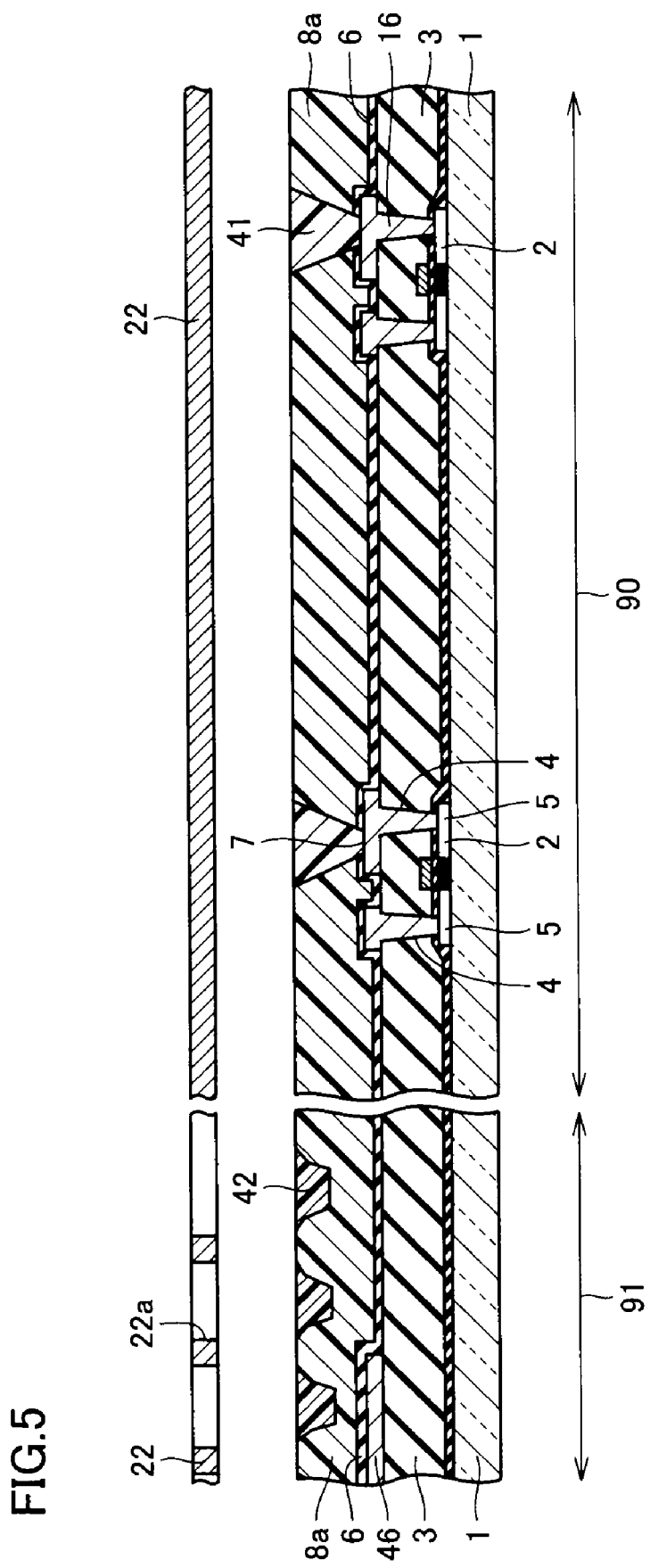
FIG. 5 is a cross-sectional view illustrating a third step of the method of manufacturing the organic EL display device in the first embodiment.

FIG. 5 is a cross-sectional view illustrating a third step of the method of manufacturing the organic EL display device in the present embodiment. Then, without performing development subsequent to the first exposure step, a second exposure step is performed. In the second exposure step, exposure is performed using a photomask 22. Photomask 22 is a mask for forming the first irregularities in the surface of flattening film 8a. Photomask 22 has an opening 22a. Opening 22a is formed in a region corresponding to the region outside the display region shown with arrow 91.

In photomask 22, for example, a plurality of openings 22a in a shape of a square having a side of a length of 4 μm or greater and 8 μm or smaller are formed. The opening in the photomask for forming the irregularities is not limited as such, and an opening of any two-dimensional shape and size may be adopted. For example, an opening in the photomask may be formed in a circular shape having a radius of 4 μm or greater and 8 μm or smaller.

In the second exposure step, at least a partial surface in the region outside the display region is subjected to incomplete exposure to form an incompletely exposed portion 42. A region in flattening film 8a in which a flattening film pattern does not remain as a final shape is subjected to incomplete exposure. Alternatively, the region in the flattening film outside the region where the connection hole is formed is subjected to incomplete exposure.

Here, in the present invention, incomplete exposure refers to such exposure that an exposed object is not completely removed in a prescribed development period in a direction of film thickness in which exposure is performed, by varying (decreasing) a dissolving rate of an exposed portion in a developer. In the present embodiment, incomplete exposure refers to an exposure technique in which decomposition of a photosensitive material in a direction of depth is lowered so as to avoid penetration during development.

In the second exposure step, lamp luminous exposure of 80 $mJ/cm^2$ was set as the condition for incomplete exposure. By performing exposure under this exposure condition, incompletely exposed portion 42 was formed in a concave shape to a depth of approximately 450 nm from the surface.

Figure 6:
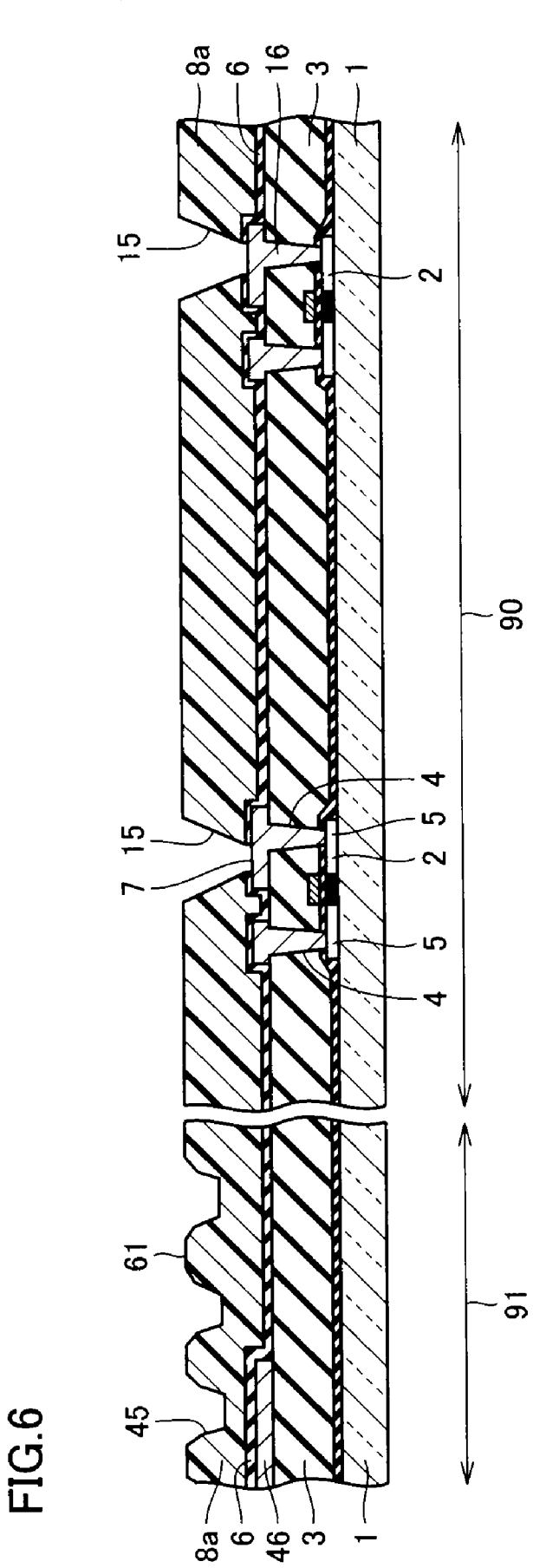
FIG. 6 is a cross-sectional view illustrating a fourth step of the method of manufacturing the organic EL display device in the first embodiment.

FIG. 6 is a cross-sectional view illustrating a fourth step of the method of manufacturing the organic EL display device in the present embodiment. Then, by developing flattening film 8a, completely exposed portion 41 and incompletely exposed portion 42 formed in flattening film 8a are removed. Connection hole 15 is formed in flattening film 8a. Recess portion 45 like a crater can be formed in the surface of flattening film 8a. By forming a plurality of recess portions 45, irregularities can be formed in a part of the surface of flattening film 8a.

In the present embodiment, in the second exposure step for forming recess portion 45, incomplete exposure is performed. If complete exposure is performed, interconnection 46 under flattening film 8a and cathode 12 covering flattening film 8a are short-circuited. Alternatively, even in incomplete exposure, if luminous exposure is great, a distance between interconnection 46 and cathode 12 becomes shorter, capacitance is increased, and wiring delay may be caused in interconnection 46. In order to avoid wiring delay, a film thickness of flattening film 8a between interconnection 46 and cathode 12 is preferably not smaller than 1000 nm.

In the present embodiment, a distance between a deepest portion of recess portion 45 and protection film 6 is not smaller than 1000 nm. Namely, the film thickness of flattening film 8a is not smaller than 1000 nm also in the region where recess portion 45 is formed. Therefore, the problem of short-circuiting or wiring delay can be avoided.

Thereafter, a curing and baking treatment is performed for 1 hour at an atmosphere temperature of 220° C. By performing the curing and baking treatment, excessive solvent is removed. In addition, cross-linking reaction of the resin material is promoted and the flattening film is burnt. The curing and baking treatment is effective to remove moisture absorbed in the photomechanical process. In the present embodiment, irregularities are formed in the surface of the flattening film. Therefore, the surface for releasing moisture is greater and a time period required for dehydration can be shortened.

Figure 7:
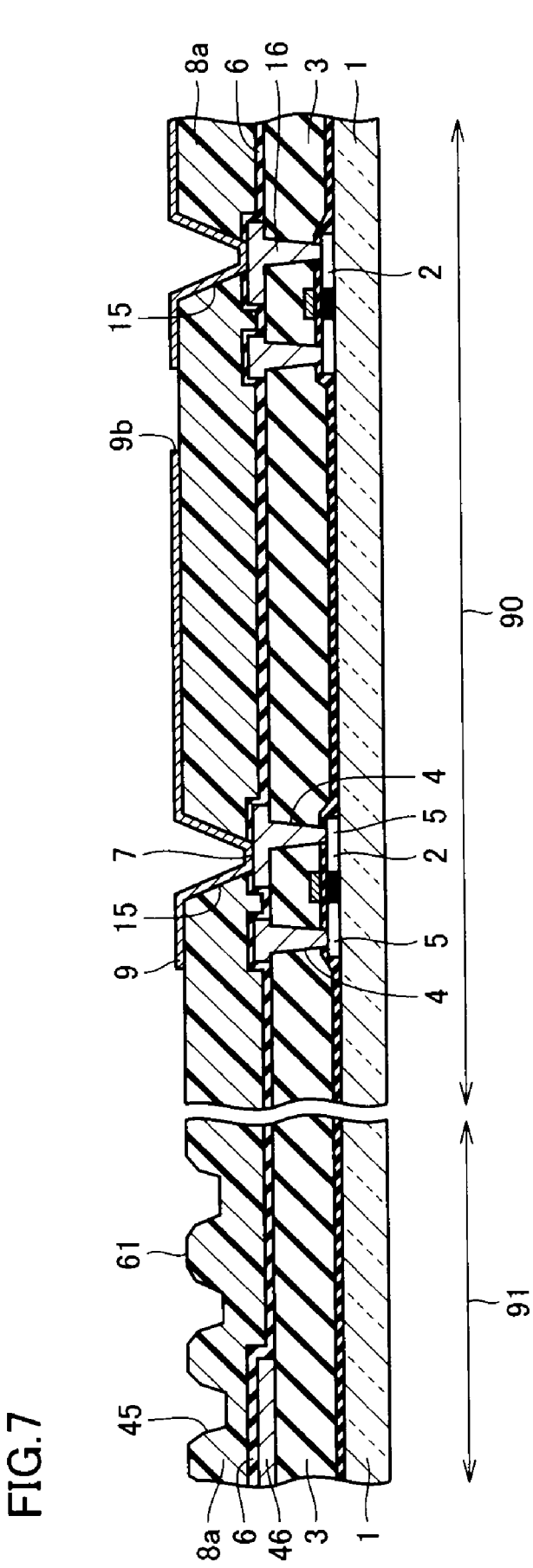
FIG. 7 is a cross-sectional view illustrating a fifth step of the method of manufacturing the organic EL display device in the first embodiment.

FIG. 7 is a cross-sectional view illustrating a fifth step of the method of manufacturing the organic EL display device in the present embodiment. Then, the pixel electrode forming step of forming a pixel electrode serving as the first electrode is performed. Anode 9 serving as the pixel electrode is formed on the surface of flattening film 8a.

Initially, anode 9 is formed on the surface of connection hole 15 and through hole 7. Anode 9 is electrically connected to source/drain interconnection 16 through connection hole 15 and through hole 7.

In the present embodiment, anode 9 is formed from Mo (molybdenum) using DC magnetron sputtering. Sputtering is performed using an Mo target as the target and Ar (argon) gas. Sputtering was performed under such conditions that Ar gas was set to 100 sccm, a pressure was set to 0.14 Pa, power was set to 1.0 Kw, and a temperature was set to 100° C. Anode 9 was formed to a film thickness of 100 nm.

A film thickness of anode 9 is preferably 50 nm or larger, in order to obtain sufficient reflectance. On the other hand, if the film thickness is too large, protrusions are generated on the surface of the film and flatness becomes poor. Therefore, the thickness is preferably 100 nm or smaller.

In the present embodiment, though the anode is formed from Mo (molybdenum), the embodiment is not limited as such. Cr (chromium), Ag (silver), Al (aluminum), Pd (palladium), or other metals may be employed. In addition, for a bottom emission display device, a transparent conductive film is selected for the anode. For example, ITO (indium tin oxide), IZO (indium zinc oxide), ZnO (zinc oxide), or the like may be used as the transparent conductive film.

Thereafter, isolation portion 9b is formed by performing patterning through photomechanical process and etching. By forming isolation portion 9b, anode 9 is isolated for each pixel. Initially, a resist film of a desired pattern is formed with a photomechanical process. Etching is performed using an etchant obtained by mixing phosphoric acid, nitric acid and acetic acid. After etching, washing with water is performed for 10 minutes to sufficiently wash away the etchant. Thereafter, the resist film that is no longer necessary is removed with a resist removal liquid. Thereafter, washing with water is performed to form anode 9 serving as the pixel electrode. In the pixel electrode forming step, as the wet step using liquid is performed several times, flattening film 8a absorbs a large amount of water.

Figure 8:
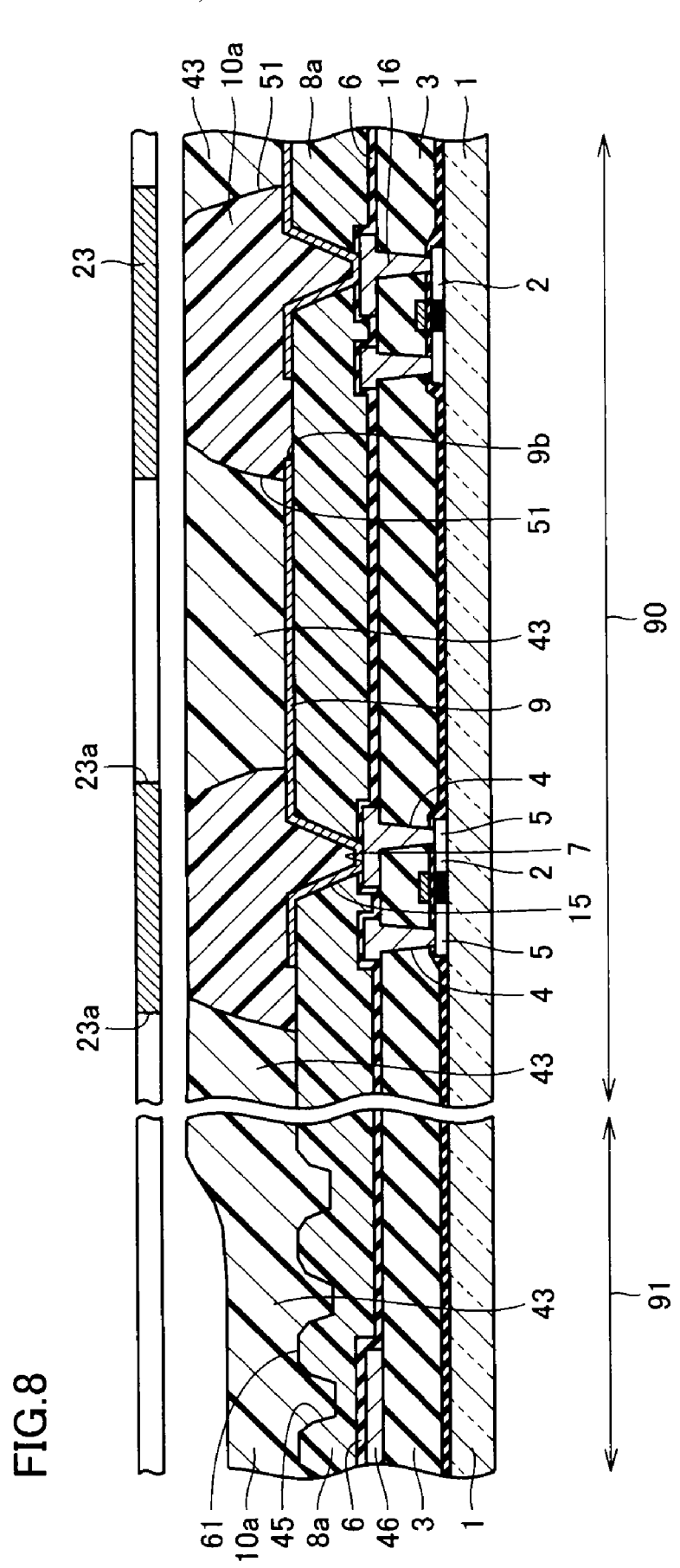
FIG. 8 is a cross-sectional view illustrating a sixth step of the method of manufacturing the organic EL display device in the first embodiment.

FIG. 8 is a cross-sectional view illustrating a sixth step of the method of manufacturing the organic EL display device in the present embodiment. Then, isolation film 10a serving as a pixel isolation film is formed around anode 9 for each pixel that is formed on the surface of flattening film 8a. In the present embodiment, a photosensitive polyimide material is used as the second photosensitive material. Initially, the photosensitive polyimide material is arranged to a film thickness of approximately 1500 nm with spin coating, so as to cover entire anode 9 and flattening film 8a.

In the present embodiment, though the photosensitive polyimide material is used as the material for forming the isolation film, the embodiment is not limited as such. For example, a photosensitive acrylic resin material may be employed. The method for arranging the photosensitive resin is not limited to spin coating, and any method such as slit spin coating, roll coating, spraying, or the like may be adopted. Thereafter, the pre-bake treatment is performed for 2 minutes at a temperature of 120° C.

Thereafter, using a photomask 23, a third exposure step is performed. Photomask 23 is a mask for forming an opening for arranging the organic EL layer in the isolation film. Isolation film 10a is subjected to complete exposure such that the opening is formed in the region where anode 9 is arranged, in the flat surface of flattening film 8a. A completely exposed portion 43 is formed as a result of complete exposure. As a condition for complete exposure of the photosensitive polyimide material having a film thickness of 1500 nm, lamp luminous exposure of 340 mJ/cm$^2$ was optimal.

Figure 12:
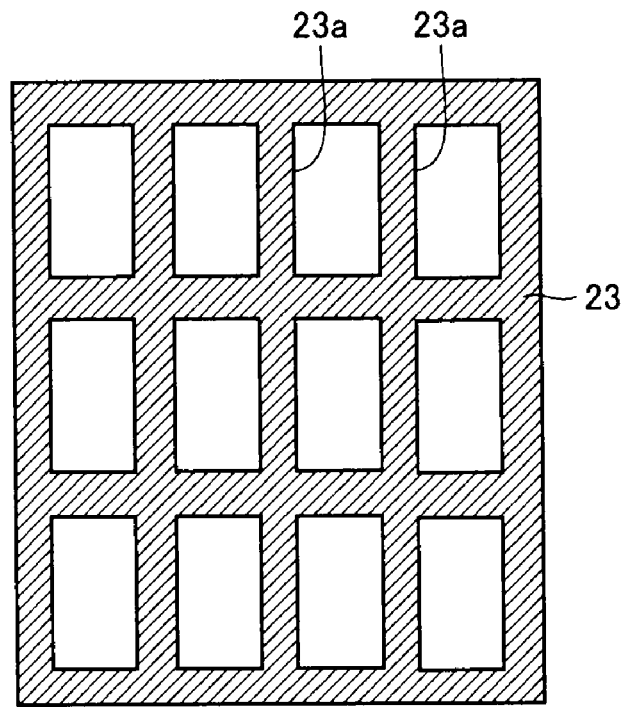
FIG. 12 is a schematic plan view of a photomask in the first embodiment.

FIG. 12 is a schematic plan view of a photomask for forming the opening in the isolation film. Photomask 23 has a plurality of openings 23a. Openings 23a are formed corresponding to respective pixels. Opening 23a in the present embodiment is formed to have a rectangular two-dimensional shape.

Referring to FIGS. 8 and 12, in the region outside the display region shown with arrow 91, opening 23a is formed to allow complete exposure. Smaller photomask 23 may be formed so as not to block light in the region outside the display region.

Figure 9:
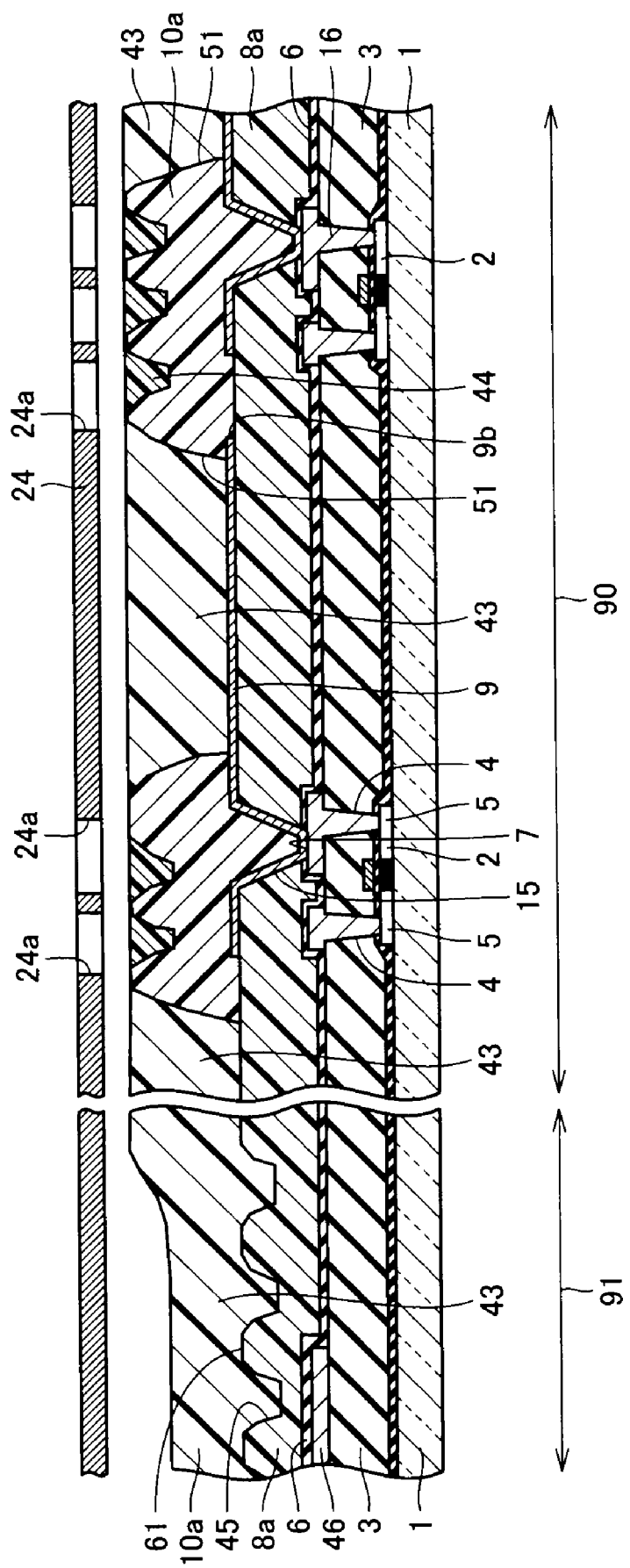
FIG. 9 is a cross-sectional view illustrating a seventh step of the method of manufacturing the organic EL display device in the first embodiment.

FIG. 9 is a cross-sectional view illustrating a seventh step of the method of manufacturing the organic EL display device in the present embodiment. Then, using a photomask 24, a fourth exposure step is performed. Photomask 24 is a mask for forming second irregularities in the surface of the isolation film. In the fourth exposure step, incomplete exposure for forming irregularities in the surface of isolation film 10a is performed. By performing incomplete exposure, an incompletely exposed portion 44 is formed in the top surface of isolation film 10a.

The fourth exposure step in the present embodiment is performed before development. By performing incomplete exposure, incompletely exposed portion 44 is formed. In the present embodiment, incompletely exposed portion 44 is formed in the region of isolation film 10a, except for the end portion serving as slope portion 51. In the present embodiment, incompletely exposed portion 44 is formed in a region inside the region of isolation film 10a serving as slope portion 51.

Figure 13:
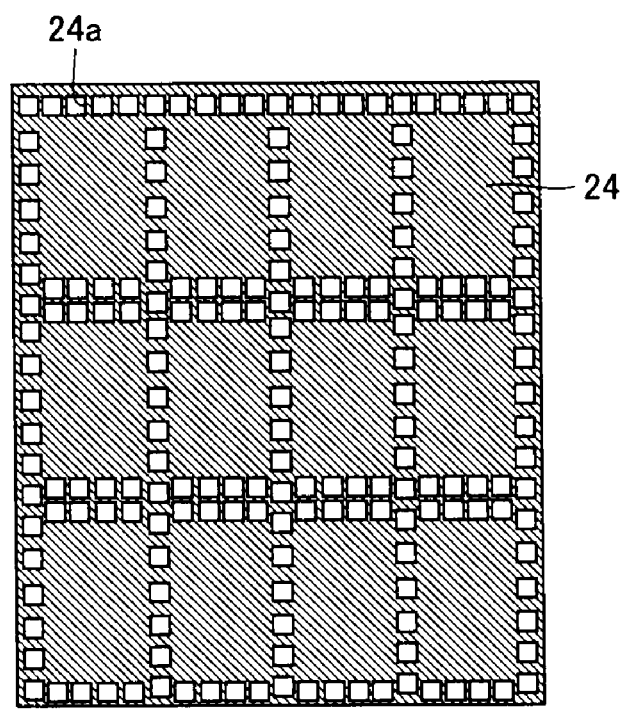
FIG. 13 is a schematic plan view of another photomask in the first embodiment.

FIG. 13 is a schematic plan view of a photomask for forming irregularities in the surface of the isolation film. Photomask 24 has a plurality of openings 24a. A plurality of openings 24a are formed at a distance from each other. Opening 24a is formed in a region between pixels. Photomask 24 in the present embodiment has opening 24a formed, in a shape of a square having a side of a length of approximately 4 μm or greater and approximately 8 μm or smaller.

The photomask for forming the irregularities in the surface of the organic insulating film is not limited as such, and a photomask having an opening of any two-dimensional shape and size may be adopted. For example, an opening in the photomask may be formed in a circular shape having a radius of approximately 4 μm or greater and approximately 8 μm or smaller.

As the condition for incomplete exposure in the present embodiment, lamp luminous exposure was set to 280 mJ/cm$^2$. By performing exposure under this exposure condition, a recess portion like a crater was formed, without the recess portion reaching flattening film 8 or anode 9 present under isolation film 10a.

Referring to FIGS. 9 and 13, photomask 24 is formed such that the region outside the display region shown with arrow 91 is not exposed. Opening 24a is formed in a region of isolation film 10a, except for completely exposed portion 43.

Figure 10:
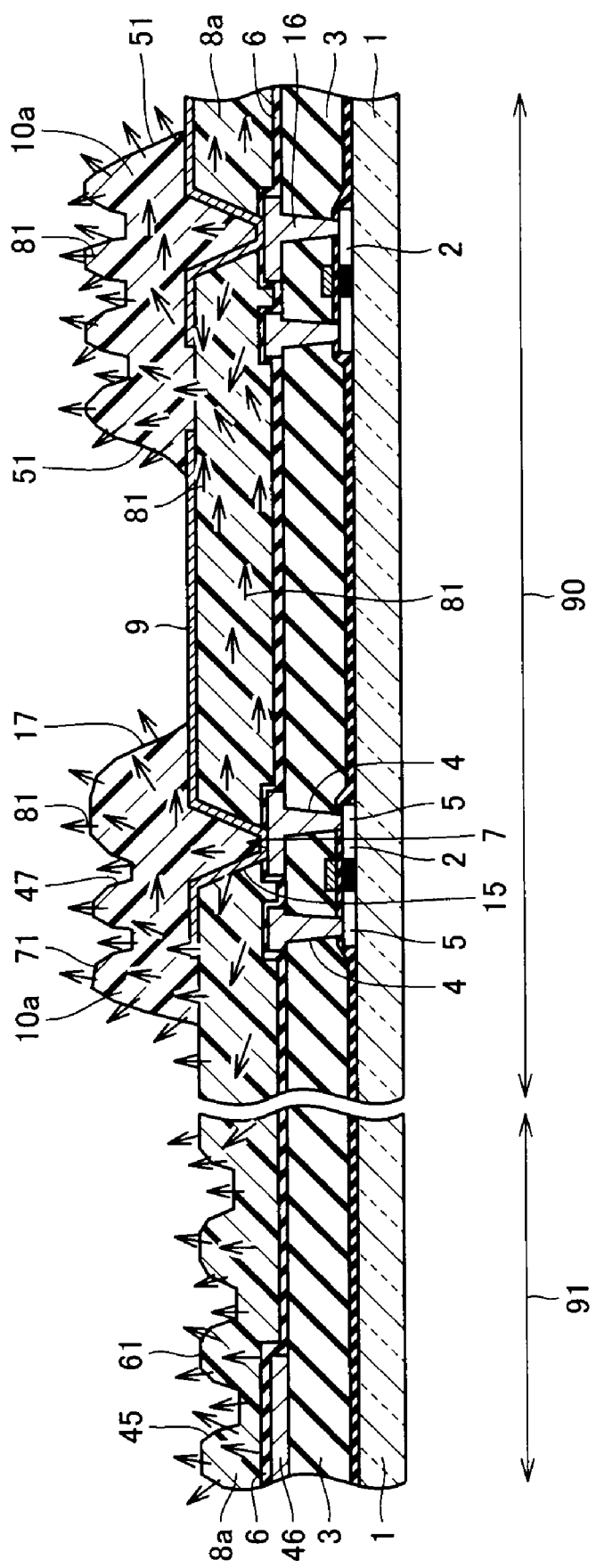
FIG. 10 is a cross-sectional view illustrating an eighth step of the method of manufacturing the organic EL display device in the first embodiment.

FIG. 10 is a cross-sectional view illustrating an eighth step of the method of manufacturing the organic EL display device in the present embodiment. Then, development is performed to remove completely exposed portion 43 and incompletely exposed portion 44.

In the display region shown with arrow 90, isolation film 10a having irregularities 71 on the surface can be formed. Recess portion 47 can be formed not to penetrate isolation film 10a. By forming recess portion 47, short-circuiting between cathode 12 formed above isolation film 10a and anode 9 formed under isolation film 10a and resultant defective light emission can be prevented.

An opening 17 serving as the pixel region can be formed in isolation film 10a. Slope portion 51 can be formed at the end portion of isolation film 10a. In the region outside the display region shown with arrow 91, flattening film 8a having irregularities 61 in the surface is exposed.

Thereafter, by performing the curing and baking treatment at a temperature of 230° C. for 1 hour, excessive solvent is removed. In addition, cross-linking reaction of the resin material is promoted and isolation film 10a is burnt. The curing and baking treatment is effective to remove moisture that has been absorbed in the photomechanical process.

In the present embodiment, irregularities are formed in the surface of flattening film 8a outside the display region and in the surface of isolation film 10a in the display region. Namely, irregularities are formed in the surface of the organic insulating film. Therefore, the surface area for releasing moisture is increased and a time period required for dehydration can be shortened.

Thereafter, organic residues are removed by washing with ozone water. Washing with ozone water in the present embodiment was performed under such conditions as ozone concentration of 10 to 30 ppm, an amount of water of 20 L/minute, and a treatment time of 2 minutes. In the portion where the organic EL layer is to be formed, i.e., the exposed portion of anode 9, residue of the resist resulting when the anode is patterned or residue of the isolation film resulting when the isolation film is formed may remain. If foreign matters such as residues are present in the exposed portion of anode 9 that forms the organic EL layer, such foreign matters cause extremely small thickness of the organic EL layer or failure of formation of the organic EL layer. Consequently, a dark spot may be generated or short-circuiting between the anode and the cathode may occur. By washing with ozone water, these foreign matters can be removed.

Thereafter, the substrate is placed in an apparatus including a vacuum heating chamber, an organic EL vapor deposition chamber, a cathode film forming chamber, and a passivation film forming chamber. In the present embodiment, dehydration by heating in vacuum atmosphere is performed. Thereafter, vapor deposition of the organic EL layer, formation of the cathode, and formation of the passivation film are successively performed. Chambers in the present embodiment are connected to each other by a carrier chamber and the device can be carried through vacuum atmosphere.

Initially, a preheating step for removing moisture that has remained in the organic insulating film such as the flattening film and the isolation film in the manufacturing process so far is performed. The preheating step in the present embodiment is performed with the use of the vacuum heating chamber. In the preheating step, the device is heated for 1 hour at a temperature of 200° C.

In the preheating step, as moisture is released into the vacuum heating chamber, a degree of vacuum in the vacuum heating chamber becomes poorer. In the present embodiment, the degree of vacuum that is reached when the vacuum heating chamber is idle is approximately $5 \times 10^{-7}$ Pa. The degree of vacuum becomes poorer when heating is started. The degree of vacuum in the vacuum heating chamber after 1 hour, however, was equal to the degree of vacuum that is reached when the vacuum heating chamber is idle. It can be seen from this result that moisture was sufficiently removed in the preheating step.

Here, a similar test was conducted, as a comparative example which will be described later, for a device in which irregularities are not formed in the surface of the flattening film and the surface of the isolation film. Namely, a device in which the entire surface of the flattening film and the isolation film is flat was manufactured and this device was subjected to a similar preheating step. Consequently, the degree of vacuum fell only to approximately $2 \times 10^{-6}$ Pa even after heating for 2 hours at a temperature of 200° C. It can be seen that moisture was not completely removed even after preheating for 2 hours in the device representing the comparative example.

Referring to FIG. 10, moisture contained in flattening film 8a and isolation film 10a passes through flattening film 8a and isolation film 10a, as shown with an arrow 81. Moisture is mainly released from the exposed surface of flattening film 8a and isolation film 10a.

In the display region shown with arrow 90, a primary interface from which moisture contained in the flattening film or the isolation film is released to the outside is the surface of isolation film 10a. In addition, in the region outside the display region shown with arrow 91, if the isolation film is not provided as in the present embodiment, the surface of flattening film 8a serves as a primary interface from which moisture is released to the outside.

In the present embodiment, as irregularities are formed in the surface of the flattening film and the isolation film, the surface area for releasing moisture in the dehydration step is increased. Accordingly, sufficient dehydration can be achieved in a short period of time. In addition, moisture that remains inside the organic EL display device can sufficiently be removed, and the organic EL display device free from deterioration of luminance and achieving high reliability can be provided. In particular, deterioration of display characteristics at an outer peripheral portion of the display region can be prevented.

Figure 11:
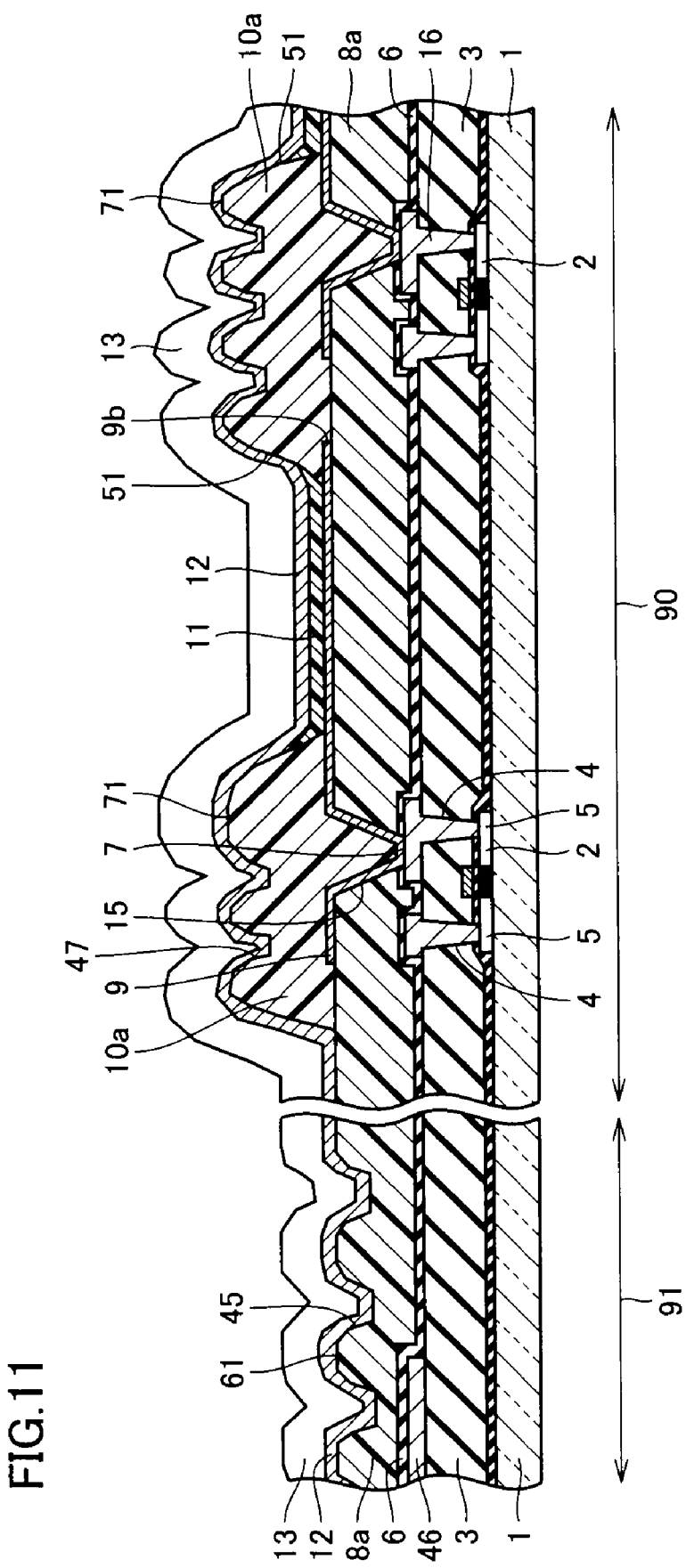
FIG. 11 is a cross-sectional view illustrating a ninth step of the method of manufacturing the organic EL display device in the first embodiment.

FIG. 11 is a cross-sectional view illustrating a ninth step of the method of manufacturing the organic EL display device in the present embodiment. Then, the device is carried to the organic EL vapor deposition chamber via the carrier chamber connected to the vacuum heating chamber. Organic EL layer 11 is formed on the surface of anode 9 exposed in the opening of isolation film 10a. Organic EL layer 11 is formed, for example, with a mask vapor deposition method.

Each layer in organic EL layer 11 is formed while a vacuum state is held. Organic EL layer 11 in the present embodiment is implemented by successively forming a hole transport layer, a light-emitting layer, and an electron injection layer. In the present embodiment, a bis[(N-naphthyl)-N-phenyl]benzidine (α-NPD) layer serving as the hole transport layer, a 8-quinolinol aluminum complex (Alq) layer serving as the light-emitting layer, and a bathocuproin layer serving as the electron injection layer were successively formed to a thickness of 40 nm, 30 nm, and 50 nm, respectively. Organic EL layer 11 is not limited as such, and any organic EL layer may be formed.

Thereafter, the device is carried to the cathode film forming chamber via the carrier chamber connected to the organic EL vapor deposition chamber. In the cathode film forming chamber, cathode 12 is formed to cover at least the entire display region. By forming cathode 12, the organic EL element is formed.

Cathode 12 in the present embodiment is formed by forming an MgAg film to a thickness of 10 nm with vacuum vapor deposition and by forming an ITO (indium tin oxide) film on the surface thereof to a thickness of 60 nm with sputtering.

In vacuum vapor deposition, vapor deposition was performed with resistance heating under the degree of vacuum of $10^{-5}$ Pa. The MgAg film may be formed with sputtering or the like.

Sputtering for forming the ITO film was performed under such conditions that Ar (argon) gas was set to 50 sccm, $O_2$ (oxygen) was set to 1 sccm, a pressure was set to 0.1 Pa, power was set to 0.42 kW, and a temperature was set to 23° C. Though the ITO film was formed as the transparent conductive film in the present embodiment, the embodiment is not limited as such and other transparent conductive films such as an IZO (indium zinc oxide) film may be formed.

Thereafter, the device is carried to the passivation film forming chamber via the carrier chamber connected to the cathode film forming chamber. In the passivation film forming chamber, passivation film 13 is formed to cover the entire surface.

In the present embodiment, passivation film 13 is formed with plasma CVD. Conditions for film formation are set such that $SiH_4$, $N_2O$ and He as a material gas are fed at a flow rate of 30 sccm, 200 sccm, and 500 sccm, respectively. SiON was formed to a film thickness of 3000 nm under such conditions that high-frequency power was set to 100 W, a pressure was set to 1.0 Torr (0.133 KPa), and a temperature in the chamber was set to 120° C.

In the present embodiment, by sufficiently removing moisture in the organic insulating film, an organic EL display panel with high reliability can be manufactured. In addition, as film formation up to the passivation film is performed in vacuum atmosphere, the organic EL device in which lowering in reliability is suppressed can be formed.

Thereafter, the display region where the organic EL element is formed is sealed with glass. Thereafter, connection with an external driver is made, whereby the organic EL display device can be manufactured.

Here, a method of manufacturing an organic EL display device representing a comparative example of the present embodiment will be described with reference to FIGS. 14 to 17. FIGS. 14 to 17 are schematic cross-sectional views in respective steps. In the organic EL display device representing the comparative example, irregularities are not formed in the surface of the flattening film and the isolation film, that is, the surface is flat.

Figure 14:
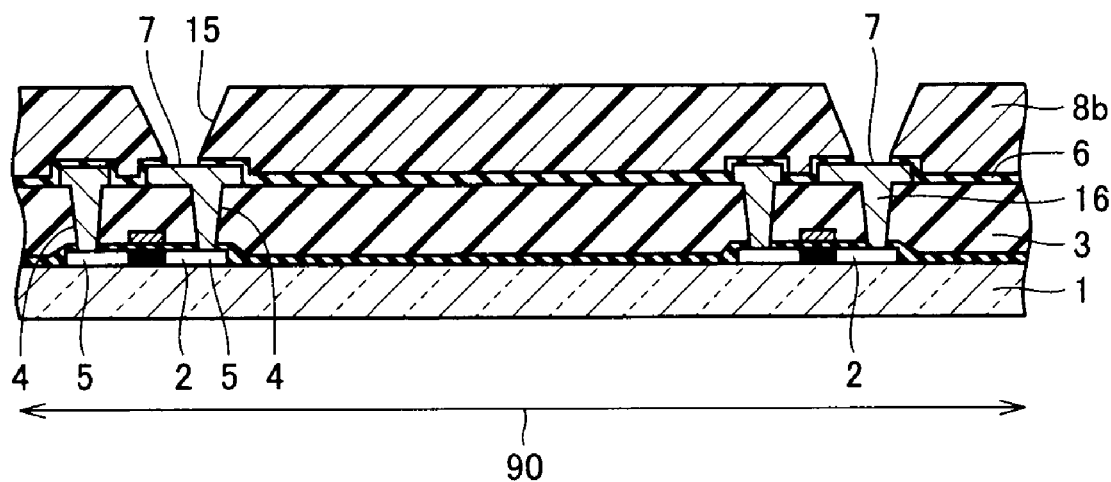
FIG. 14 is a cross-sectional view illustrating a first step of a method of manufacturing an organic EL display device in a comparative example of the first embodiment.

FIG. 14 illustrates a first step of the method of manufacturing the organic EL display device representing the comparative example of the present embodiment. TFT 2 for driving the organic EL element is formed on the surface of glass substrate 1. Inorganic insulating film 3 composed of SiOx or the like is formed to cover TFT 2. Interconnection hole 4 is formed in inorganic insulating film 3. Source/drain interconnection 16 is formed in the surface of inorganic insulating film 3, on which protection film 6 composed of SiNx or the like is formed. Through hole 7 is formed in protection film 6. Through hole 7 is formed in correspondence with source/drain interconnection 16 connected to the drain region of TFT 2.

Thereafter, in order to flatten the step in the surface, a flattening film 8b implemented by the organic insulating film is formed. After application of the organic insulating film with spin coating, as in the case of the protection film, the organic insulating film is subjected to an exposure and development treatment to form an opening for exposing a part of source/drain interconnection 16 connected to the drain region of TFT 2. The organic insulating film is subjected to the curing and baking treatment in atmosphere after the development treatment, so as to remove the organic solvent contained inside, whereby the organic insulating film is burnt. Here, moisture absorbed in the development process is removed to some extent.

Figure 15:
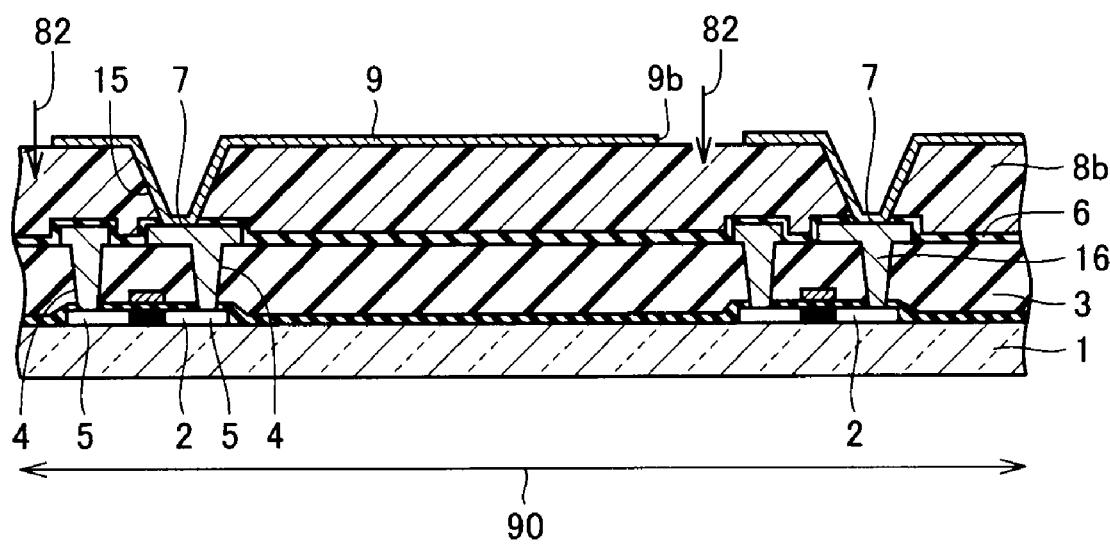
FIG. 15 is a cross-sectional view illustrating a second step of the method of manufacturing the organic EL display device in the comparative example of the first embodiment.

FIG. 15 illustrates a second step of the method of manufacturing the organic EL display device representing the comparative example of the present embodiment. Then, anode 9 is formed on the surface of flattening film 8b with sputtering, and thereafter, patterning for forming isolation portion 9b with an etching step is performed. Anode 9 is isolated by isolation portion 9b for each pixel. In the step of forming anode 9, a wet treatment including the etching step, the resist separation step, the step of washing with water, and the like is performed, and flattening film 8b is directly exposed to water. Therefore, flattening film 8b absorbs a large amount of water as shown with an arrow 82.

Figure 16:
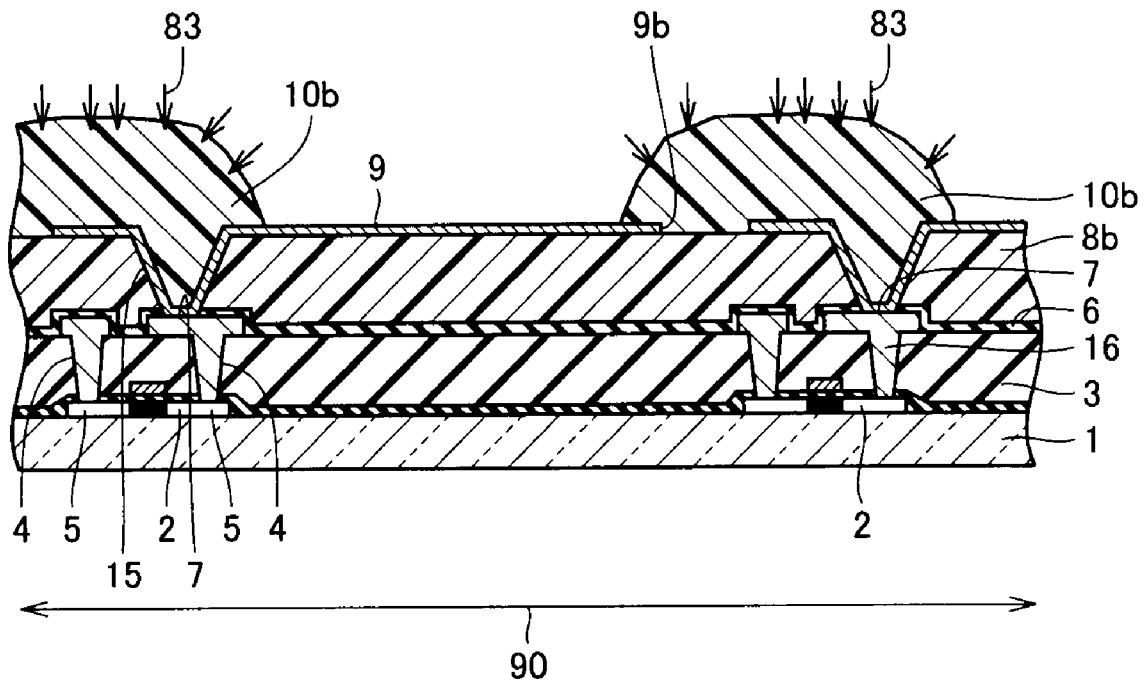
FIG. 16 is a cross-sectional view illustrating a third step of the method of manufacturing the organic EL display device in the comparative example of the first embodiment.

FIG. 16 illustrates a third step of the method of manufacturing the organic EL display device representing the comparative example of the present embodiment. Thereafter, isolation film 10b implemented by the organic insulating film is formed around the end portion of anode 9. In forming isolation film 10b, a material for the organic insulating film is applied with spin coating, and patterned to expose a part of anode 9. Patterning is performed with a photomechanical process including exposure and development.

Thereafter, the curing and baking treatment is performed in atmosphere to remove the organic solvent contained inside, whereby the isolation film is burnt. In the curing and baking treatment of isolation film 10b, absorbed moisture is removed to some extent.

Thereafter, in order to remove foreign matters such as particles on anode 9, a cleaning step basically including washing with water is performed. In the cleaning step, isolation film 10b absorbs a large amount of water as shown with an arrow 83.

Thereafter, formation of the organic EL layer, formation of the cathode, and various types of sealing are performed to manufacture the organic EL display device.

In the organic EL display device representing the comparative example, a defect that the moisture that remains inside reaches the organic EL layer and a dark region grows from a peripheral portion of the display region was noticeably observed.

Figure 17:
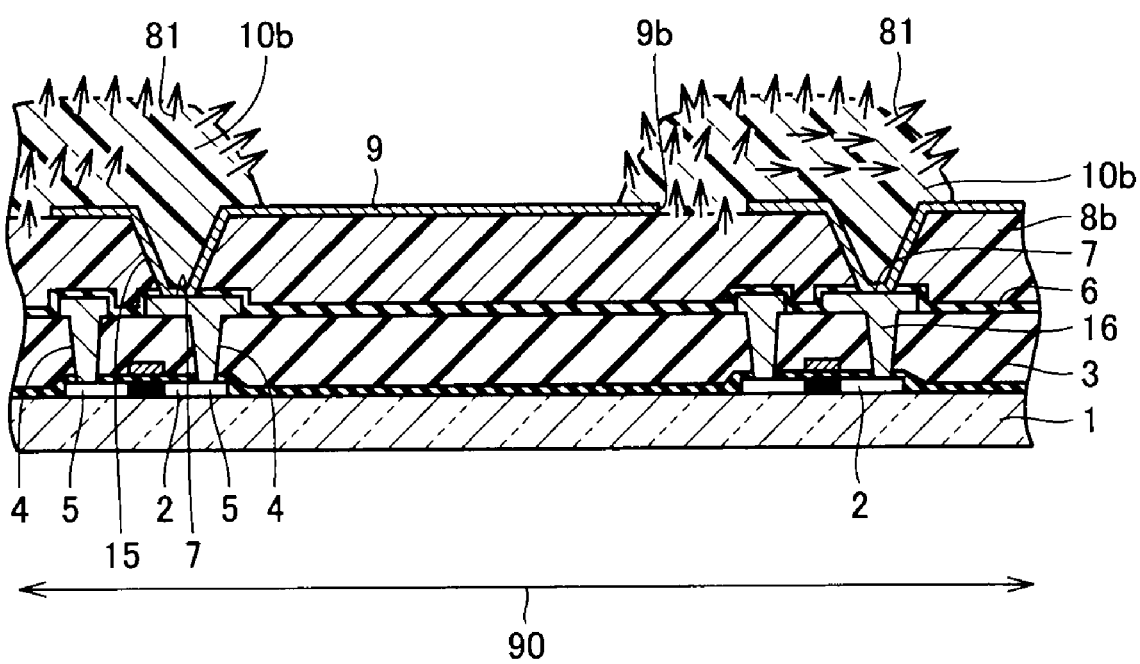
FIG. 17 is a schematic cross-sectional view of the organic EL display device in the comparative example of the first embodiment when an organic insulating film releases moisture.

FIG. 17 is a schematic cross-sectional view of the organic EL display device representing the comparative example of the present embodiment when the organic insulating film releases moisture. Moisture present inside flattening film 8b or isolation film 10b moves through flattening film 8b and isolation film 10b as shown with arrow 81.

In particular, flattening film 8b absorbs a large amount of water through the wet treatment in patterning anode 9 located directly above. When dehydration through heat treatment is attempted, anode 9 impedes diffusion of moisture and a sufficient dehydration effect could not be obtained.

In contrast, the organic EL device in the present embodiment can achieve a sufficient dehydration effect, because irregularities are formed in the surface of at least one of the flattening film and the isolation film so as to increase an area for releasing moisture.

Figure 18:
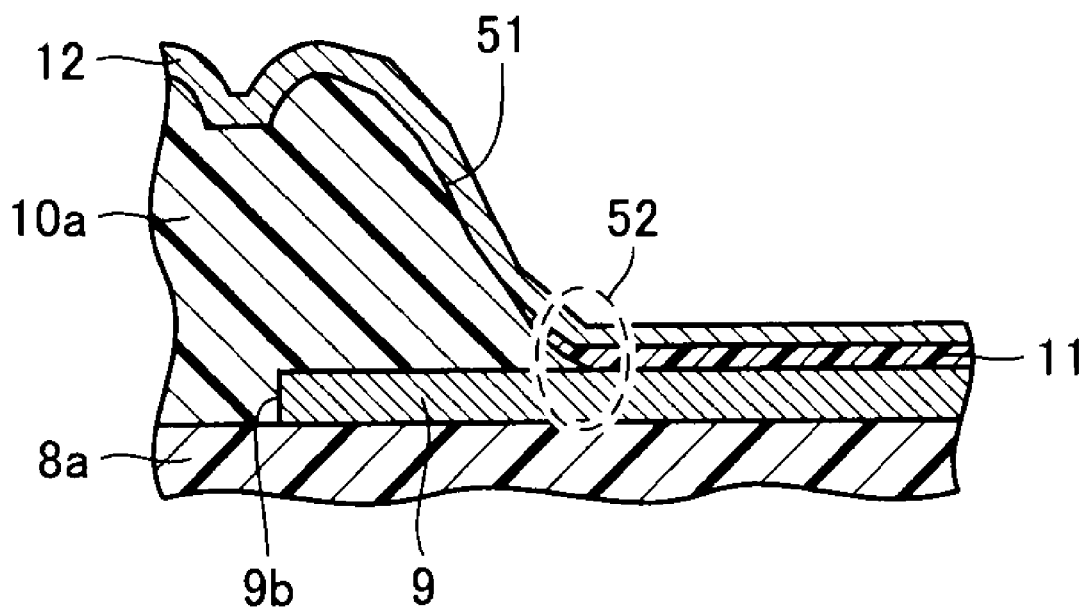
FIG. 18 is an enlarged schematic cross-sectional view of an end portion of an isolation film of the organic EL display device in the first embodiment.

FIG. 18 is a schematic cross-sectional view of the end portion of the isolation film of the organic EL display device in the present embodiment. Isolation film 10a in the present embodiment is formed to have a substantially trapezoidal cross-sectional shape. Isolation film 10a has slope portion 51 formed to have a gradually decreasing film thickness at the end portion. Irregularities formed in the surface of isolation film 10a are formed at a position except for the end portion. The irregularities in the present embodiment are formed in a region except for slope portion 51. Irregularities in the surface of isolation film 10a are formed in the top surface of the trapezoid representing the cross-sectional shape.

Isolation film 10a has a function as a base for a mask in mask vapor deposition of organic EL layer 11. Isolation film 10a formed to cover the end portion of anode 9 has a function to partition each pixel at a tip end portion 52. In addition, tip end portion 52 has a function to prevent short-circuiting between anode 9 and cathode 12.

Figure 19:
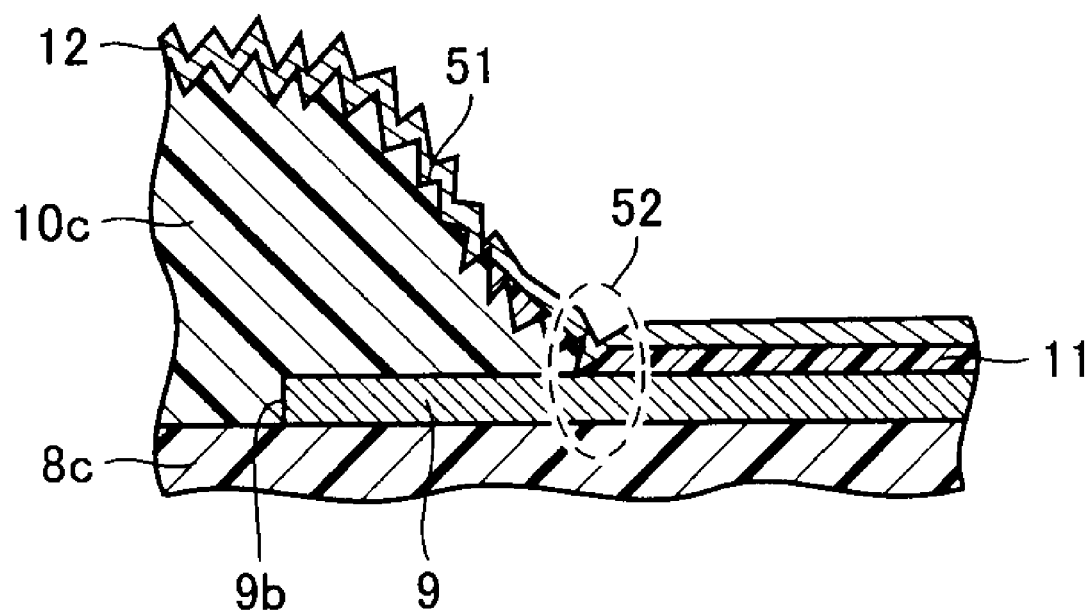
FIG. 19 is an enlarged schematic cross-sectional view of an end portion of an isolation film of an organic EL display device representing another comparative example of the first embodiment.

FIG. 19 is a schematic cross-sectional view of an end portion of an isolation film of an organic EL display device representing another comparative example of the present embodiment. The organic EL display device in another comparative example has a flattening film 8c and an isolation film 10c. Isolation film 10c is formed to have a substantially trapezoidal cross-sectional shape. Isolation film 10c has slope portion 51. Irregularities are formed in the entire surface of isolation film 10c. Irregularities in the surface are formed also in slope portion 51, in addition to the top surface of isolation film 10c. Irregularities are also formed at tip end portion 52 of isolation film 10c.

In the step of forming organic EL layer 11, for example, EL vapor deposition that is highly likely to proceed linearly is performed. When irregularities are formed in slope portion 51 of isolation film 10c, molecules to be vapor-deposited are introduced not substantially in a direction of a normal to the surface of irregularities in isolation film 10c but from a direction diagonal to the surface of irregularities. In an extreme case, a hidden portion with respect to vapor deposition may be present due to irregularities in isolation film 10c.

Consequently, a film thickness of organic EL layer 11 provided at tip end portion 52 of isolation film 10c becomes extremely small or the organic EL layer may become discontinuous. Accordingly, a distance between anode 9 and cathode 12 becomes smaller and electric field becomes higher, which may result in discharge breakdown. In addition, contact between anode 9 and cathode 12 causes short mode fault. As a current tends to flow through a short-circuited portion more preferentially than through the organic EL layer, the pixel turns out to be a non-illuminating pixel. In the display device, a non-illuminating point defect is caused.

Therefore, the isolation film preferably does not have irregularities in the surface of the slope portion. The isolation film preferably has a slope portion of which slope is more gentle toward the inside. In particular, preferably, irregularities are not present at the tip end portion of the isolation film. According to such a structure, coverage characteristic of the organic EL layer at the tip end portion of the isolation film is improved so that discharge breakdown, short-circuiting or the like can be suppressed.

The preheating step for removing moisture in the organic insulating film in the present embodiment is performed after ozone water washing for washing the surface of the pixel electrode, however, the embodiment is not limited as such. The preheating step may be performed at timing after completion of the wet treatment and before the step of forming the organic EL layer.

For example, in performing dry cleaning such as UV-$O_3$ treatment or $O_2$ plasma treatment for removing impurities at the surface of the pixel electrode, the preheating step may be performed before these steps. For example, UV-$O_3$ treatment is performed for 4 minutes under such conditions as luminance of UV (ultraviolet) of 26 µW/cm$^2$, dry air of 1000 sccm, and pressure of 100 Torr (13.3 KPa). Alternatively, for example, $O_2$ plasma treatment is performed for 30 seconds under such conditions as $O_2$ of 800 sccm, pressure of 400 Pa, and high-frequency power of 100 W.

Carrying from the preheating step to the step of forming the organic EL layer is preferably performed without passing through atmosphere, in order to avoid absorption of moisture. For example, carrying through the carrier chamber isolated from outer air is preferred.

Irregularities to be formed in the surface of the flattening film in the present embodiment are formed in the entire region outside the display region, however, the embodiment is not limited as such. The irregularities should only be formed in at least a part of the region outside the display region. In addition, irregularities to be formed in the surface of the isolation film should only be formed in at least some isolation films out of a plurality of isolation films.

Irregularities are formed in the surface of the organic insulating film with the photomechanical process in the present embodiment, however, the embodiment is not limited as such, and irregularities may be formed in the surface with any method. For example, irregularities may mechanically be formed in the surface of the organic insulating film using an abrasive cloth.

Second Embodiment

An organic EL display device and a method of manufacturing an organic EL display device in a second embodiment of the present invention will be described with reference to FIGS. 20 to 22.

The organic EL display device in the present embodiment is similar to that in the first embodiment in that the first irregularities are formed in the surface of the flattening film in the region outside the display region and also in that the second irregularities are formed in the top surface of the isolation film in the display region. In the present embodiment, the second irregularities are formed in the surface of the isolation film using plasma treatment. Irregularities formed with plasma treatment are random, and recess portions and projecting portions of random sizes are arranged.

The method of manufacturing the organic EL display device in the present embodiment will be described with reference to FIGS. 20 to 22. FIGS. 20 to 22 are schematic cross-sectional views in respective steps.

Figure 20:
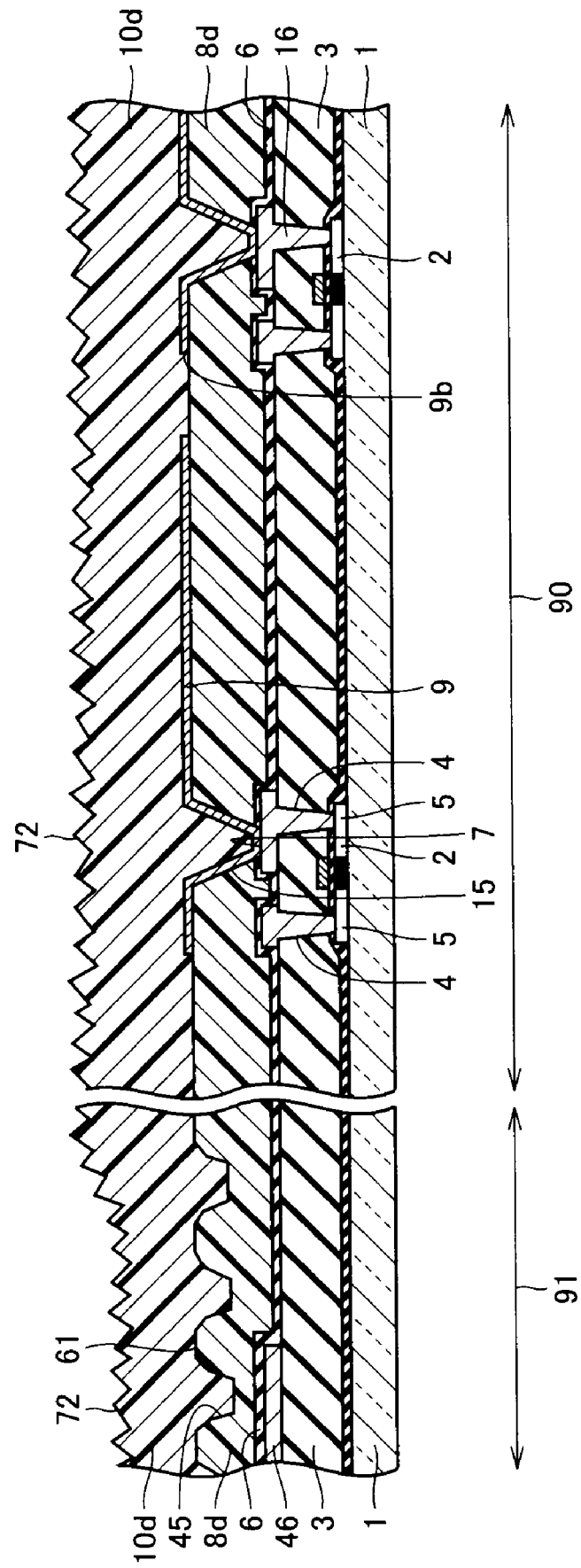
FIG. 20 is a cross-sectional view illustrating a first step of a method of manufacturing an organic EL display device in a second embodiment.

FIG. 20 illustrates a first step of the method of manufacturing the organic EL display device in the present embodiment. TFT 2, inorganic insulating film 3 and a flattening film 8d are formed on glass substrate 1. Irregularities 61 are formed in the surface of flattening film 8d in the region outside the display region shown with arrow 91. Irregularities 61 are formed with a photomechanical process. Anode 9 is formed on the surface of flattening film 8d in correspondence with each pixel.

Thereafter, in the present embodiment, the step of forming the isolation film is performed. In the present embodiment, a photosensitive polyimide material is used as the second photosensitive material. An isolation film 10d is arranged on the entire surface to a film thickness of approximately 2000 nm with spin coating.

In the present embodiment, isolation film 10d is formed to be thicker than in the first embodiment. This is because a thickness that decreases through the plasma treatment to subsequently be performed is taken into consideration. Thereafter, the pre-bake treatment is performed for 2 minutes at a temperature of 120° C.

Thereafter, a first plasma treatment step is performed. In the first plasma treatment step, the entire surface of isolation film 10d is subjected to plasma treatment. In the first plasma treatment step in the present embodiment, dry etching using $O_2$ plasma is performed.

In the present embodiment, as the plasma treatment is performed before development and curing and baking treatment, the isolation film may be exposed to light emitted by the plasma. In the present embodiment, the treatment is performed using a remote plasma technique, in which plasma is generated at a position distant from a portion to be treated, active species is carried, and an object is treated.

By adopting the remote plasma technique for the plasma treatment, exposure of a photosensitive film can be prevented. As a photomechanical process can be employed in patterning the isolation film, patterning can readily be performed.

In the present embodiment, radicals of oxygen are generated by feeding oxygen through the inside of a high-frequency waveguide. Etching is performed by introducing the radicals into the chamber. In the present embodiment, a quartz tube is arranged inside the waveguide, to which high-frequency is applied at high-frequency power of 4000 W. The quartz tube is arranged to extend in a direction perpendicular to a direction in which the waveguide extends. By feeding $O_2$ at a flow rate of 2.0 L/minute through the quartz tube, oxygen radicals are generated in the waveguide.

Thereafter, generated oxygen radicals were introduced into the chamber where the device is placed and etching treatment was performed for 600 seconds. Referring to FIG. 20, as the thickness of isolation film 10d decreases, irregularities 72 are formed in the surface. Irregularities 72 are formed in the entire surface of isolation film 10d. In the present embodiment, by performing the first plasma treatment, a film thickness of a polyimide film serving as isolation film 10d attained to approximately 1500 nm.

In the present embodiment, an area of 1 $\mu m^2$ in the surface of isolation film 10d was measured with AFM (Atomic Force Microscopy), and arithmetic mean deviation of roughness profile Ra was approximately 70 nm.

In the first plasma treatment step in the present embodiment, $O_2$ is used as the dry etching gas for plasma treatment, however, the embodiment is not limited as such. For example, similar treatment can be performed also with the use of $CF_4$, $NF_3$, $C_2F_6$, or the like.

Figure 21:
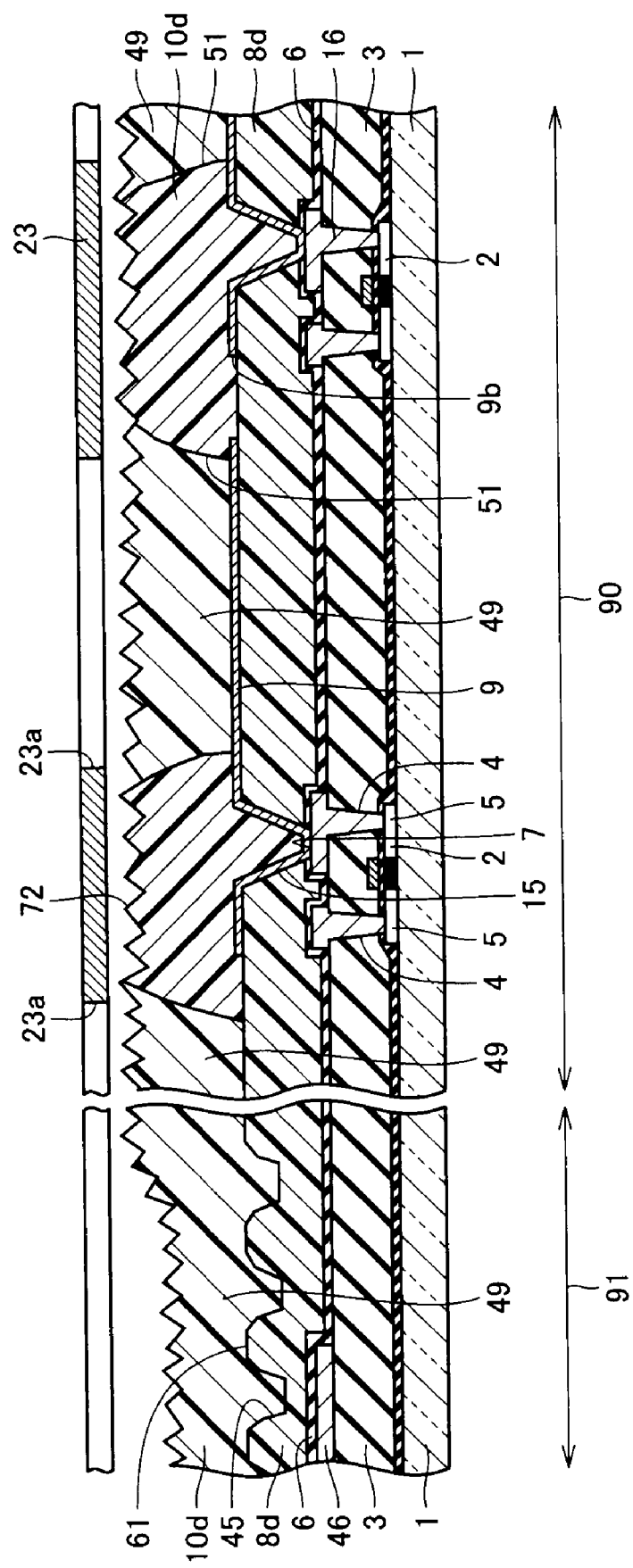
FIG. 21 is a cross-sectional view illustrating a second step of the method of manufacturing the organic EL display device in the second embodiment.

FIG. 21 is a cross-sectional view illustrating a second step of the method of manufacturing the organic EL display device in the present embodiment. Then, patterning of the isolation film is performed using the photomechanical process. Exposure is performed using photomask 23 having opening 23a. Opening 23a is formed to expose a pixel portion. By performing exposure through opening 23a, a completely exposed portion 49 is formed.

Figure 22:
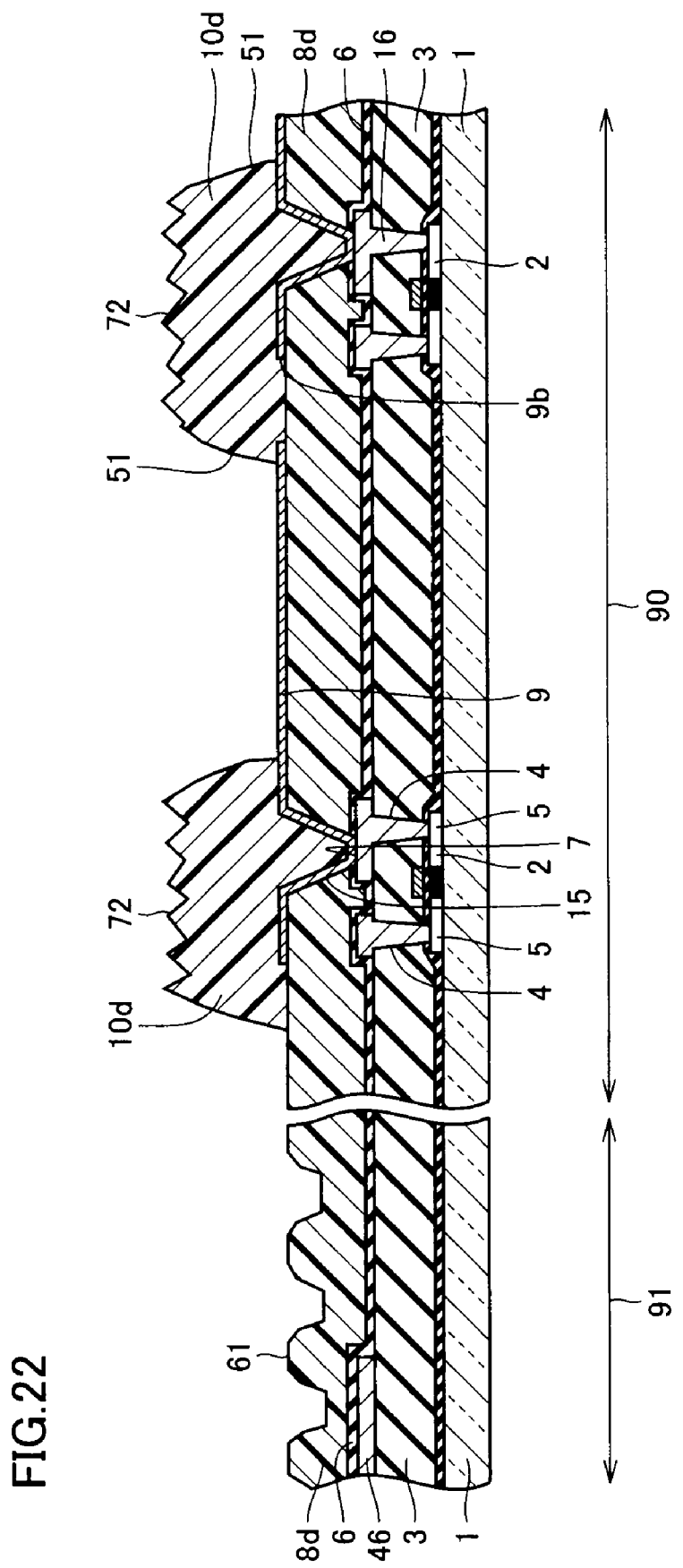
FIG. 22 is a cross-sectional view illustrating a third step of the method of manufacturing the organic EL display device in the second embodiment.

FIG. 22 is a cross-sectional view illustrating a third step of the method of manufacturing the organic EL display device in the present embodiment. Thereafter, the development step is performed. By performing development, completely exposed portion 49 is removed and isolation film 10d having a substantially trapezoidal cross-sectional shape is formed. Isolation film 10d has slope portion 51 at the end portion. Slope portion 51 does not have irregularities formed in the surface, and it is formed like a smooth, curved surface.

Thereafter, for example, the curing and baking treatment is performed for 1 hour in atmosphere at a temperature of 230° C. In the curing and baking step, the solvent is removed, imidization of polyimide is promoted, and isolation film 10d is burnt.

Thereafter, the preheating step is performed. By performing the preheating step, moisture that remains inside the organic EL display device can sufficiently be removed. In the method of manufacturing the organic EL display device in the present embodiment as well, irregularities 72 are formed in the top surface of isolation film 10d. Accordingly, an area for releasing moisture can be increased and moisture contained in the flattening film or the isolation film can sufficiently be removed.

Irregularities formed in the surface of the isolation film in the present embodiment have arithmetic mean deviation of roughness profile Ra per 1 $\mu m^2$ of 70 nm. In order to evaporate moisture in a heating step such as the curing and baking step and the preheating step, a greater surface area of the isolation film is preferred. Therefore, the irregularities formed in the surface of the isolation film preferably have greater arithmetic mean deviation of roughness profile Ra.

Excessively large irregularities in the surface, however, cause local disconnection of the cathode that is arranged on the surface of the isolation film and hence higher interconnect resistance of the cathode. Higher interconnect resistance causes remarkable voltage drop that occurs from an outer periphery of the display region toward the inside. Consequently, a problem of what is called shading, or luminance decreasing toward the inside of the display region, arises. Alternatively, disconnection of the cathode results in a non-illuminating pixel.

In a test in the present embodiment, shading was caused or a partially non-light-emitting region was produced when arithmetic mean deviation of roughness profile Ra per 1 $\mu m^2$ exceeds approximately 90 nm. In addition, display performance of the organic EL display device was unstable. In contrast, by setting arithmetic mean deviation of roughness profile Ra per 1 $\mu m^2$ to 80 nm or smaller, such a problem could be avoided.

Thus, irregularities formed in the surface of the isolation film are preferably small to some extent, and arithmetic mean deviation of roughness profile Ra per 1 $\mu m^2$ is preferably set to approximately 80 nm or smaller. According to such a structure, increase in the interconnect resistance or disconnection of the cathode can be suppressed.

In controlling a size of irregularities formed in the surface of the organic insulating film, for example, a time period for plasma treatment is set within a prescribed range of time. By extending the time for plasma treatment, irregularities become greater. Therefore, relation between the time for plasma treatment and the size of irregularities to be formed is studied in advance and the time for plasma treatment is set within a prescribed range, so that irregularities of an optimal size can be formed.

In the present embodiment, irregularities are formed in the surface of the photosensitive material for forming the organic insulating film with the remote plasma technique, however, the embodiment is not limited as such. Irregularities may be formed in the surface of the photosensitive material by directly irradiating the surface with plasma. In directly irradiating the surface with plasma, a plasma condition suppressing exposure of the photosensitive film is selected in the plasma treatment, and in addition, a selected type of resin composition is preferably used as the photosensitive material.

As the configuration, the function and effect, and the manufacturing method are otherwise the same as in the first embodiment, description will not be repeated here.

Third Embodiment

An organic EL display device and a method of manufacturing an organic EL display device in a third embodiment of the present invention will be described with reference to FIGS. 23 to 25. The method of manufacturing the organic EL display device in the present embodiment is different from that in the first embodiment in the method of forming irregularities to be formed in the surface of the flattening film and the isolation film. In the present embodiment, after patterning of the isolation film, plasma treatment for forming irregularities in the surface of the flattening film and the isolation film is performed.

Figure 23:
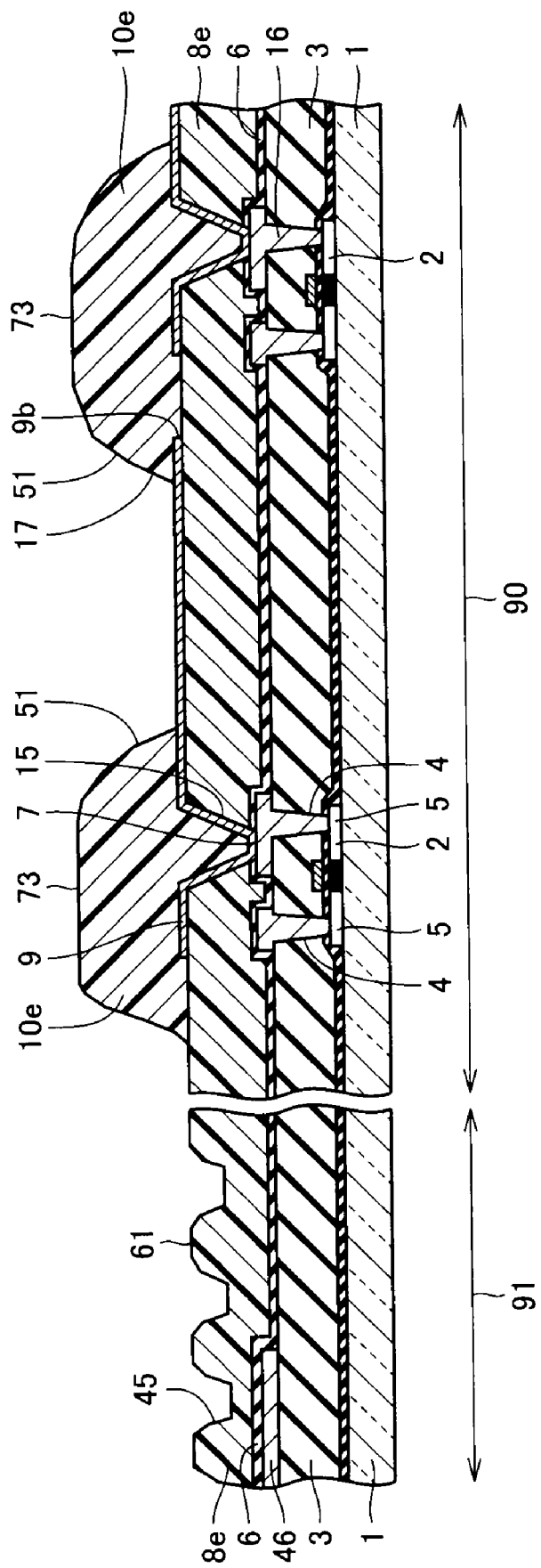
FIG. 23 is a cross-sectional view illustrating a first step of a method of manufacturing an organic EL display device in a third embodiment.
Figure 24:
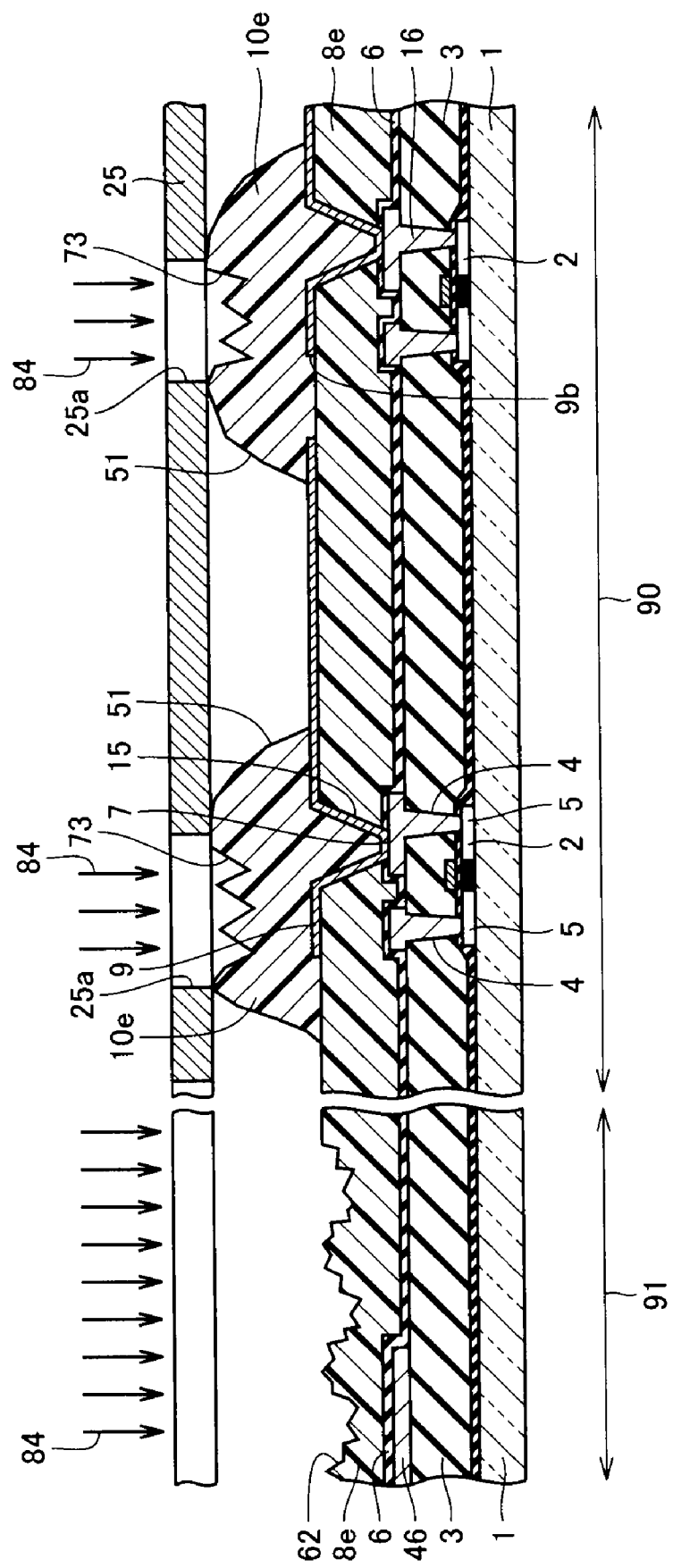
FIG. 24 is a cross-sectional view illustrating a second step of the method of manufacturing the organic EL display device in the third embodiment.

FIGS. 23 and 24 are schematic cross-sectional views of respective manufacturing steps in the present embodiment. FIG. 23 is a cross-sectional view illustrating a first step of the method of manufacturing the organic EL display device in the present embodiment. In the region outside the display region shown with arrow 91, irregularities 61 are formed in the surface of a flattening film 8e. Irregularities 61 are formed by forming a plurality of recess portions 45 with a photomechanical process. In the display region shown with arrow 90, anode 9 is formed on the surface of flattening film 8e.

Thereafter, in order to form an isolation film 10e serving as a pixel isolation film, a photosensitive polyimide material is arranged as the second photosensitive material on the entire surface to a film thickness of approximately 1500 nm with spin coating. The pre-bake treatment is performed for 2 minutes at a temperature of 120° C.

Thereafter, exposure is performed using photomask 23 having opening 23a corresponding to each pixel (see FIG. 12). Development is performed thereafter, and opening 17 is formed in a portion corresponding to the pixel region. Isolation film 10e is formed to have a trapezoidal cross-sectional shape.

Thereafter, post-baking is performed for 1 hour at a temperature of 230° C. Isolation film 10e is burnt. In the present embodiment, at this stage, irregularities have not yet been formed in the surface of isolation film 10e.

Thereafter, a second plasma treatment step is performed as the plasma treatment in the present embodiment. The second plasma treatment step is performed after development of the organic insulating film. In the second plasma treatment step, dry etching is performed.

Figure 25:
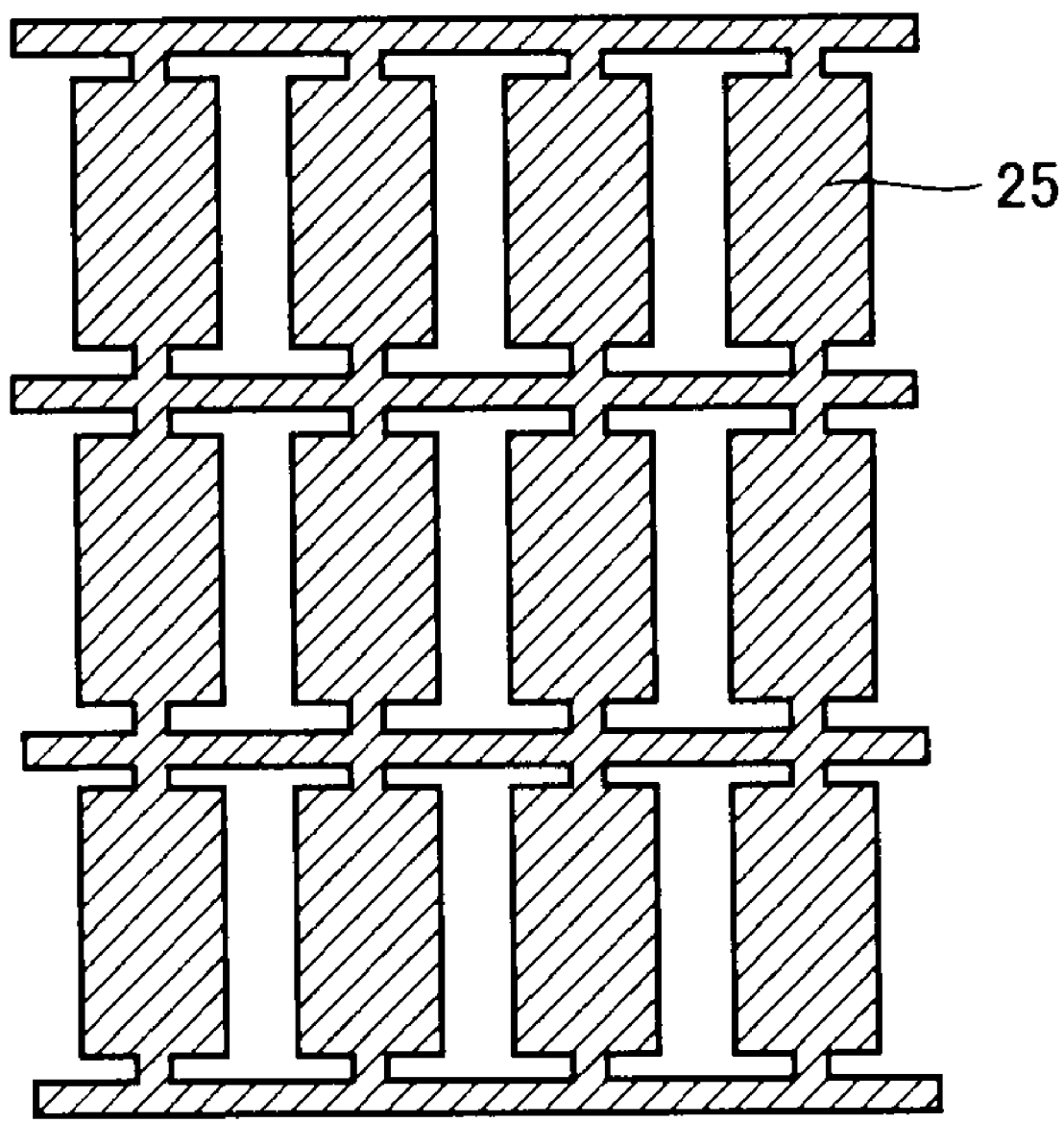
FIG. 25 is a schematic plan view of a shadow mask used in a plasma treatment step in the third embodiment.

FIG. 25 is a schematic plan view of a shadow mask used in the plasma treatment step in the present embodiment. A shadow mask 25 is formed to cover a region that serves as the organic EL layer. Shadow mask 25 is formed to cover the slope portion of the isolation film. Shadow mask 25 is formed to expose the region between pixels.

FIG. 24 is a cross-sectional view illustrating a second step of the method of manufacturing the organic EL display device in the present embodiment. FIG. 24 is a schematic cross-sectional view when the plasma treatment step in the present embodiment is being performed.

An opening 25a in shadow mask 25 is formed in correspondence with isolation film 10e. In the present embodiment, shadow mask 25 abuts on isolation film 10e. Opening 25a abuts on isolation film 10e. In this state, by emitting active species of plasma as shown with an arrow 84, irregularities 73 are formed in the surface of isolation film 10e. Irregularities 73 are formed in the top surface of isolation film 10e. Irregularities 73 are formed in a region except for slope portion 51.

In addition, in the region outside the display region shown with arrow 91, irregularities 62 are formed in the surface of flattening film 8e. Irregularities 62 are formed in the surface of the irregularities that were formed with the photomechanical process, by further performing the plasma treatment thereon.

Dry etching in the second plasma treatment step was performed for 200 seconds under such conditions that $O_2$ was set to 200 sccm, He was set to 200 sccm, high-frequency power was set to 300 W, pressure was set to 70 Pa, and the temperature in the chamber was set to 23° C.

Thus, irregularities 73 can be formed in the surface of isolation film 10e in the display region shown with arrow 90, and the surface area of isolation film 10e can be increased. In addition, in the region outside the display region shown with arrow 91, irregularities 62 can be formed in the surface of flattening film 8e and the surface area of flattening film 8e can be increased.

Thereafter, the preheating step can be performed to efficiently remove moisture contained inside.

In the present embodiment, shadow mask 25 is arranged to be in contact with the surface of isolation film 10e. With this method, the top surface of isolation film 10e can selectively be irradiated with active species such as radicals and ions produced by plasma. A larger amount of active species can reliably be impinged on the top surface of isolation film 10e than on slope portion 51 of isolation film 10e, and formation of irregularities in slope portion 51 can be suppressed.

In the second plasma treatment step in the present embodiment, the remote plasma technique described previously or a method of directly emitting plasma may be adopted. In the present embodiment, as the pattern formation of the isolation film has been completed, a direct plasma method may be adopted.

The present embodiment is the same as the second embodiment in that irregularities 73 to be formed in the surface of isolation film 10e are preferably formed to have arithmetic mean deviation of roughness profile Ra per 1 $\mu m^2$ of 80 nm or smaller.

Meanwhile, in the present embodiment, $O_2$ is used as the dry etching gas for the plasma treatment, however, the embodiment is not limited as such. Similar irregularities can be formed also with the use of $CF_4$, $NF_3$, or $C_2F_6$.

In addition, in the present embodiment, in the region outside the display region, irregularities are formed in advance in the surface of the flattening film using the photomechanical process, however, the embodiment is not limited as such. The first irregularities may be formed with plasma treatment, without forming the irregularities with the photomechanical process. In the case that the first irregularities are formed in the surface of the flattening film as well, the irregularities are preferably formed to have arithmetic mean deviation of roughness profile Ra per 1 $\mu m^2$ of 80 nm or smaller. According to such a structure, increase in interconnect resistance of the cathode at the surface can be suppressed in the region outside the display region.

As the configuration, the function and effect, and the manufacturing method are otherwise the same as in the first embodiment or the second embodiment, description will not be repeated here.

Fourth Embodiment

An organic EL display device and a method of manufacturing an organic EL display device in a fourth embodiment of the present invention will be described with reference to FIG. 26.

In the organic EL display device in the present embodiment, irregularities are formed in the surface of the isolation film and irregularities are formed in the surface of the flattening film in the region outside the display region. In the present embodiment, irregularities are formed with the photomechanical process in the flattening film and the isolation film, and thereafter, the flattening film and the isolation film are subjected to plasma treatment to form first irregularities and second irregularities.

Figure 26:
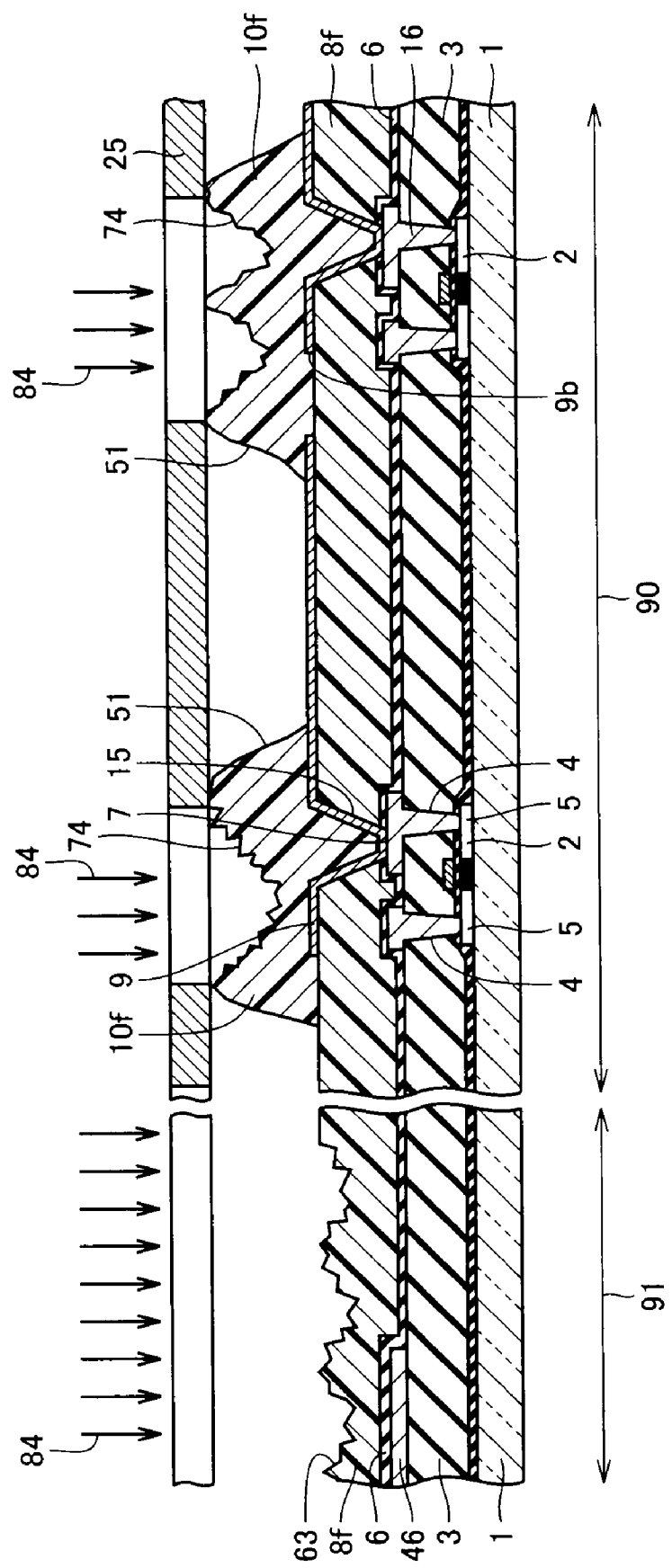
FIG. 26 illustrates a step in a method of manufacturing an organic EL display device in a fourth embodiment.

FIG. 26 is a schematic cross-sectional view of the step of manufacturing the organic EL display device in the present embodiment. The present embodiment is similar to the first embodiment in that the irregularities are formed in the surface of a flattening film 8f with the photomechanical process in the region outside the display region shown with arrow 91. In addition, the present embodiment is similar to the first embodiment in that the irregularities are formed in the region of an isolation film 10f except for slope portion 51 in the display region shown with arrow 90 (see FIG. 10).

In forming isolation film 10f in the present embodiment, the second photosensitive material is arranged on the entire surface of the substrate to a film thickness of approximately 1500 nm with spin coating. The pre-bake treatment is performed for 2 minutes at a temperature of 120° C. Isolation film 10f is subjected to complete exposure for forming an opening for arranging the organic EL layer. Incomplete exposure for forming irregularities in the top surface of isolation film 10f is performed.

Thereafter, isolation film 10f having irregularities formed in the top surface is formed by removing, through development, an exposed portion that is formed in complete exposure and incomplete exposure. Thereafter, the solvent is removed by performing the post-baking treatment for 1 hour at a temperature of 230° C. In isolation film 10f, imidization of polyimide is promoted and the isolation film is burnt.

Thereafter, the second plasma treatment step is performed after the development step. In the second plasma treatment, the plasma treatment is performed using the shadow mask for forming the first irregularities and the second irregularities in the surface of the flattening film and in the surface of the isolation film, respectively. In the second plasma treatment step, the shadow mask covering the pixel region is used (see FIG. 25).

Referring to FIG. 26, in the present embodiment, shadow mask 25 is brought into contact with the top surface of isolation film 10f. In the display region, the plasma treatment is performed through opening 25a as shown with arrow 84, so as to form irregularities 74 in the surface of isolation film 10f. In the region outside the display region, irregularities 63 are formed in the surface of flattening film 8f.

Thus, in the present embodiment, irregularities are formed in the surface of the isolation film and the flattening film with the photomechanical process. In addition, after the isolation film is developed, the second plasma treatment step is performed to form irregularities. According to the organic EL display device and the method of manufacturing the organic EL display device in the present embodiment as well, the organic EL display device in which remaining of moisture in the insulating film is suppressed and the method of manufacturing the same can be provided.

As the configuration, the function and effect, and the manufacturing method are otherwise the same as in any one of the first to third embodiments, description will not be repeated here.

In each embodiment described above, irregularities are formed in the surface of both of the isolation film and the flattening film, however, the embodiment is not limited as such. Irregularities may be formed in one of the isolation film and the flattening film.

For example, in a device in which an interconnection located under the flattening film is replaced with a gate line, an inorganic insulating film is present between the gate line and the cathode. Therefore, in the region outside the display region, the flattening film can be removed. In such a case, irregularities should be formed only in the surface of the isolation film. Alternatively, in a device where an inorganic insulating film such as a nitride film having excellent moisture blocking characteristic is formed as the isolation film, irregularities should be formed only in the surface of the flattening film. In order to form irregularities in a desired region, an opening pattern in the photomask or the shadow mask should be changed.

In each drawing above, the same or corresponding elements have the same reference characters allotted. In addition, in the present invention, denotation as "on", "above" or "under" does not indicate an absolute up and down direction in the vertical direction but indicates relative positional relation of each portion or member.

Although the present invention has been described and illustrated in detail, it is clearly understood that the same is by way of illustration and example only and is not to be taken by way of limitation, the scope of the present invention being interpreted by the terms of the appended claims.

What is claimed is:

1. An organic EL display device, comprising:
a substrate;
a protection film;
a flattening film arranged above said protection film,
a plurality of first electrodes arranged on a surface of said flattening film; and
a plurality of organic EL layers arranged on a surface of said first electrodes,
said flattening film having first irregularities being independent of said protection film and not penetrating said flattening film, and
wherein said first irregularities have an arithmetic mean deviation of roughness profile Ra per 1 $\mu m^2$ of at most 80 nm.

2. The organic EL display device according to claim 1, wherein said flattening film has a film thickness of at least 1000 nm at a deepest portion in a recess portion of said first irregularities.

3. An organic EL display device, comprising:
a substrate;
a protection film;
a flattening film arranged above said protection film;
a plurality of first electrodes arranged on a surface of said flattening film;
a plurality of organic EL layers arranged on a surface of said first electrodes; and
an isolating film arranged on said first electrodes and covering end portions of said first electrodes adjacent to each other,
said flattening film having first irregularities being independent of said protection film and not penetrating said flattening film,
said isolating film having a slope portion with a gradually decreasing film thickness at an end portion,
said isolating film having second irregularities in a surface of a region except for said slope portion, and
wherein said second irregularities have an arithmetic mean deviation of roughness profile Ra per 1 $\mu m^2$ of at most 80 nm.

4. The organic EL display device according to claim 3, wherein said isolating film is formed on the surface of said first electrodes, and a recess portion of said second irregularities does not penetrate said isolating film.

5. The organic EL display device according to claim 1, wherein additional first irregularities are formed on said flattening film outside a display region, the display region including said plurality of organic EL layers and the corresponding circuitry.

6. The organic EL display device according to claim 3, wherein additional first irregularities are formed on said flattening film outside a display region, the display region including said plurality of organic EL layers and the corresponding circuitry.

* * * * *